US012658270B2

(12) United States Patent
Lee et al.

(10) Patent No.: US 12,658,270 B2
(45) Date of Patent: Jun. 16, 2026

(54) SEMICONDUCTOR PACKAGE FOR PERFORMING TRAINING OPERATION

(71) Applicant: SK hynix Inc., Icheon-si (KR)

(72) Inventors: Seong Ju Lee, Icheon-si (KR); Yong Sun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 354 days.

(21) Appl. No.: 18/096,279

(22) Filed: Jan. 12, 2023

(65) Prior Publication Data

US 2024/0047003 A1 Feb. 8, 2024

(30) Foreign Application Priority Data

Aug. 8, 2022 (KR) ........................ 10-2022-0098596

(51) Int. Cl.
| | |
|---|---|
| *G11C 29/10* | (2006.01) |
| *G11C 7/22* | (2006.01) |
| *H10W 72/59* | (2026.01) |
| *H10W 72/90* | (2026.01) |
| *H10W 90/00* | (2026.01) |
| *H10W 90/24* | (2026.01) |

(52) U.S. Cl.
CPC .............. *G11C 29/10* (2013.01); *G11C 7/222* (2013.01); *H10W 72/59* (2026.01); *H10W 72/90* (2026.01); *H10W 72/9445* (2026.01); *H10W 90/24* (2026.01); *H10W 90/752* (2026.01)

(58) Field of Classification Search
None
See application file for complete search history.

(56) References Cited

U.S. PATENT DOCUMENTS

| | | | |
|---|---|---|---|
| 2002/0169922 A1* | 11/2002 | Thomann ............... | G11C 29/50 711/100 |
| 2003/0117864 A1* | 6/2003 | Hampel .................. | G06F 3/061 365/200 |
| 2004/0179419 A1* | 9/2004 | Choi ................. | G11C 29/50012 365/233.1 |
| 2013/0038380 A1 | 2/2013 | Cordero et al. | |
| 2015/0194196 A1* | 7/2015 | Huang ............. | G11C 29/12015 711/105 |
| 2020/0342923 A1* | 10/2020 | Lee ....................... | G11C 29/023 |
| 2021/0027816 A1* | 1/2021 | Richards ................ | G11C 5/063 |

FOREIGN PATENT DOCUMENTS

| | | |
|---|---|---|
| KR | 20050115908 A | 12/2005 |
| KR | 101046272 B1 | 7/2011 |
| KR | 1020200124575 A | 11/2020 |

* cited by examiner

*Primary Examiner* — Andrew J Jung
*Assistant Examiner* — Cole Jiawei Wentzel
(74) *Attorney, Agent, or Firm* — WILLIAM PARK AND ASSOCIATES LTD.

(57) ABSTRACT

A semiconductor package includes a first memory device configured to output master data after the start of a training operation, and a second memory device configured to sample internal data based on the master data after the start of the training operation, configured to store test codes that adjust a time point at which the internal data are output when a time point at which the master data are output and the time point at which the internal data are output become identical with each other, and configured to program the stored test codes when the training operation is terminated.

15 Claims, 21 Drawing Sheets

| NORMAL OPERATION | | TRAINING OPERATION | |
|---|---|---|---|
| CID<2> | CID<1> | CID<2> | CID<1> |
| L | L | L | L |
| L | H | L | L |
| H | L | L | L |
| H | H | L | L |

FIG. 3

| NORMAL OPERATION | | TRAINING OPERATION | |
| --- | --- | --- | --- |
| CID<2> | CID<1> | CID<2> | CID<1> |
| L | L | L | L |
| L | H | L | L |
| H | L | L | L |
| H | H | L | L |

| CID<2> | CID<1> | NORMAL OPERATION |
|---|---|---|
| L | L | MEMORY 1<br>T211, R211 ACTIVE |
| L | H | MEMORY 2<br>T222, R222 ACTIVE |
| H | L | MEMORY 3<br>T233, R233 ACTIVE |
| H | H | MEMORY 4<br>T244, R244 ACTIVE |

FIG. 15

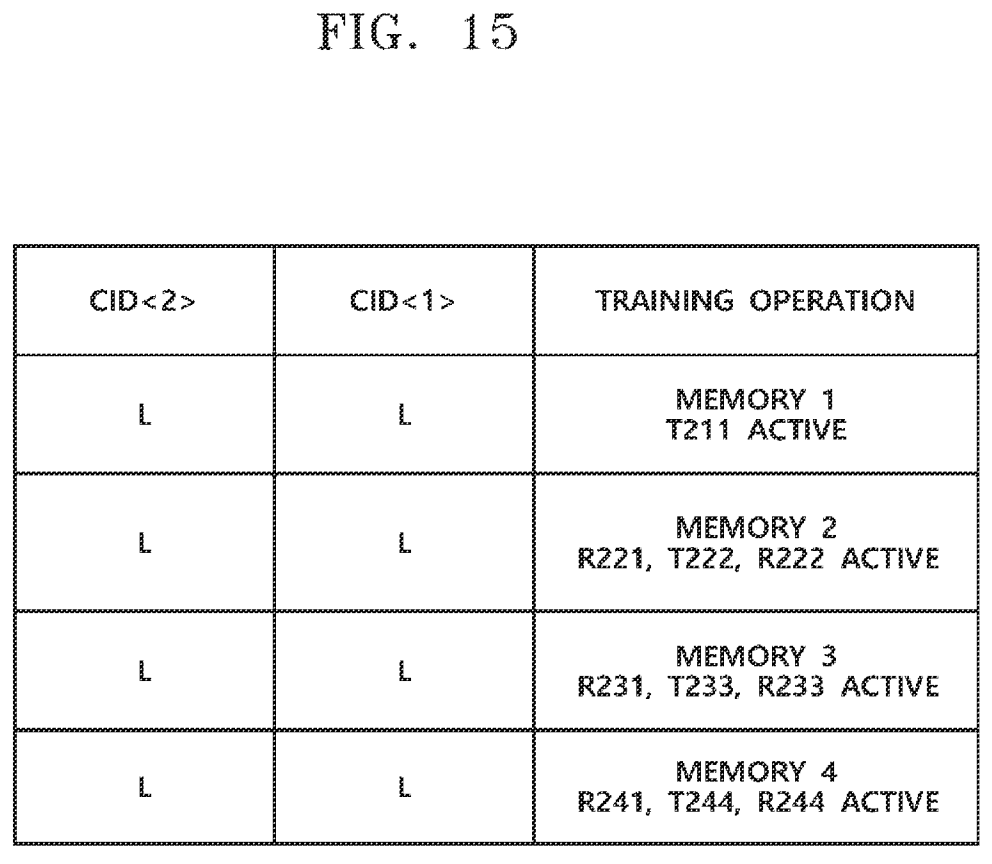

| CID<2> | CID<1> | TRAINING OPERATION |
|---|---|---|
| L | L | MEMORY 1<br>T211 ACTIVE |
| L | L | MEMORY 2<br>R221, T222, R222 ACTIVE |
| L | L | MEMORY 3<br>R231, T233, R233 ACTIVE |
| L | L | MEMORY 4<br>R241, T244, R244 ACTIVE |

FIG. 20

SEMICONDUCTOR PACKAGE FOR PERFORMING TRAINING OPERATION

CROSS-REFERENCE TO RELATED APPLICATION

The present application claims priority under 35 U.S.C. § 119(a) to Korean application number 10-2022-0098596, filed in the Korean Intellectual Property Office on Aug. 8, 2022, the entire disclosure of which is incorporated herein by reference.

BACKGROUND

The present disclosure relates to a semiconductor package for performing a training operation for making identical operating speeds of multiple memory devices.

A semiconductor memory device is a memory device that is implemented by using a semiconductor, such as silicon, germanium, gallium arsenide, or indium phosphide. The semiconductor memory device may be basically divided into a volatile memory device and a nonvolatile memory device. The volatile memory device is a memory device in which data stored therein is lost when power supplied to the memory device is blocked. The volatile memory device includes static random access memory (SRAM), dynamic RAM (DRAM), synchronous DRAM (SDRAM), etc. The nonvolatile memory device is a memory device in which data stored therein is retained although power supplied to the memory device is blocked. The nonvolatile memory device includes read only memory (ROM), programmable ROM (PROM), electrically PROM (EPROM), electrically erasable and programmable ROM (EEPROM), a flash memory device, phase-change RAM (PRAM), magnetic RAM (MRAM), resistive RAM (RRAM), ferroelectric RAM (FRAM), etc.

In general, access to a memory device may be performed through a controller. For example, after the start of data read for the memory device, a host may transmit a read command and an address to the controller. The controller may read data from the memory device and then transmit the read data to the host. After the start of data write for the memory device, the host may transmit a write command, write data, and an address to the controller. The controller may write the write data in the memory device. In such an access process for the memory device, clock signals for strobing data that are input and output in memory devices may be generated at different time points due to a process, voltage, temperature (PVT) variation. Accordingly, it is necessary to perform a training operation that adjusts time points at which the clock signals are generated to be identical.

SUMMARY

In an embodiment, a semiconductor package may include a first memory device configured to output master data after the start of a training operation, and a second memory device configured to sample internal data based on the master data after the start of the training operation, configured to store test codes that adjust a time point at which the internal data are output when a time point at which the master data are output and a time point at which the internal data are output become identical, and configured to program the stored test codes when the training operation is terminated.

In another embodiment, a semiconductor package may include a first memory device configured to sample first internal data based on master data after the start of a training operation and configured to program, in multiple electrical fuses, test codes that adjust a time point at which the first internal data are output when a time point at which the master data are output and the time point at which the first internal data are output become identical, and a second memory device configured to sample second internal data based on the master data after the start of the training operation and configured to program, in multiple electrical fuses, test codes that adjust a time point at which the second internal data are output when a time point at which the master data are output and a time point at which the second internal data are output become identical.

In still another embodiment, a semiconductor package may include a controller configured to output chip IDs having the same logic level combination after the start of a training operation and configured to output test codes that are sequentially counted, and a semiconductor package including a semiconductor device having multiple memory devices. The multiple memory devices are simultaneously enabled based on the chip IDs after the start of the training operation, and the multiple memory devices program the respective test codes when time points at which multiple internal data are output and a time point at which master data are output become identical by adjusting a delay based on the test codes.

BRIEF DESCRIPTION OF THE DRAWINGS

FIG. 3 is a table for describing chip IDs in a normal operation and a training operation according to an example of the present disclosure.

3

Figure 11:
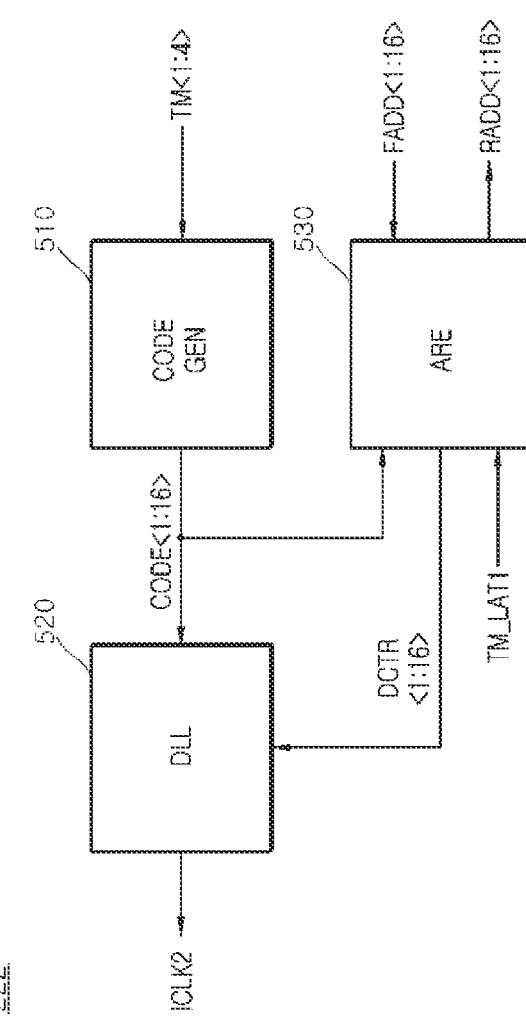
FIG. 11 is a block diagram illustrating a construction according to an example of a second clock generation circuit that is included in the second memory device illustrated in FIG. 7.
Figure 12:
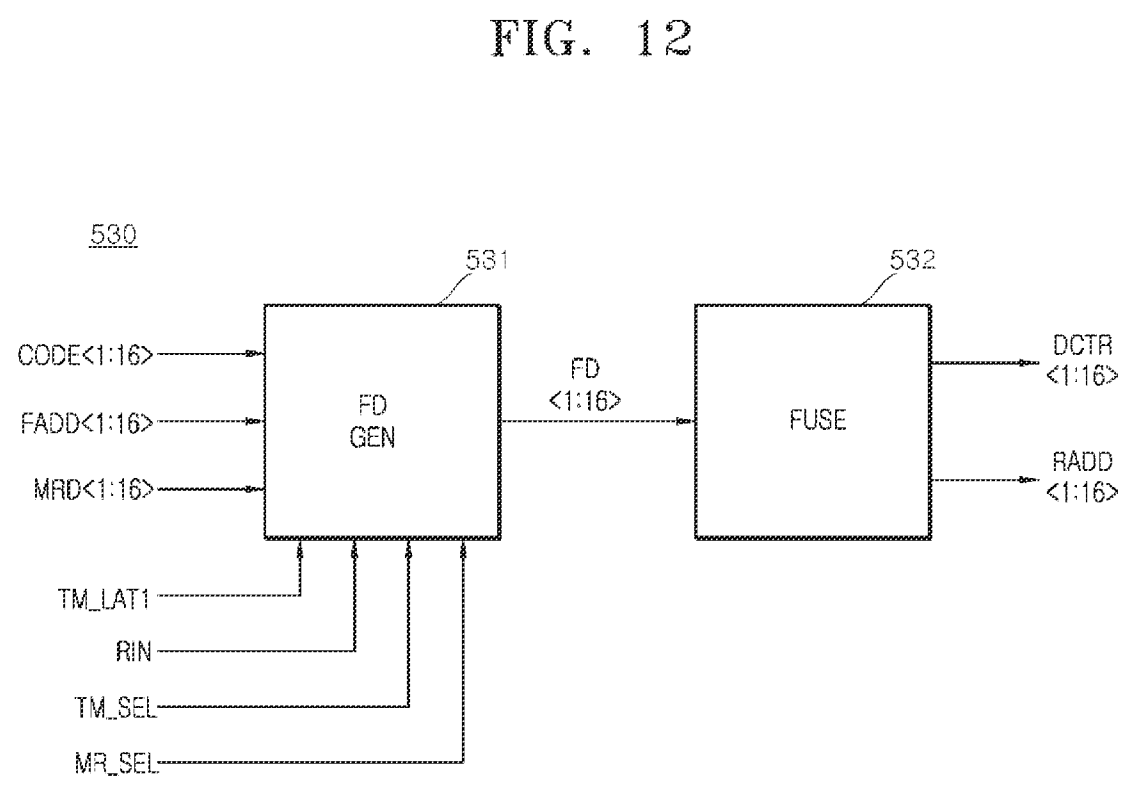

FIG. 12 is a block diagram illustrating a construction according to an example of a fuse array circuit that is included in the second clock generation circuit illustrated in FIG. 11.

Figure 13:
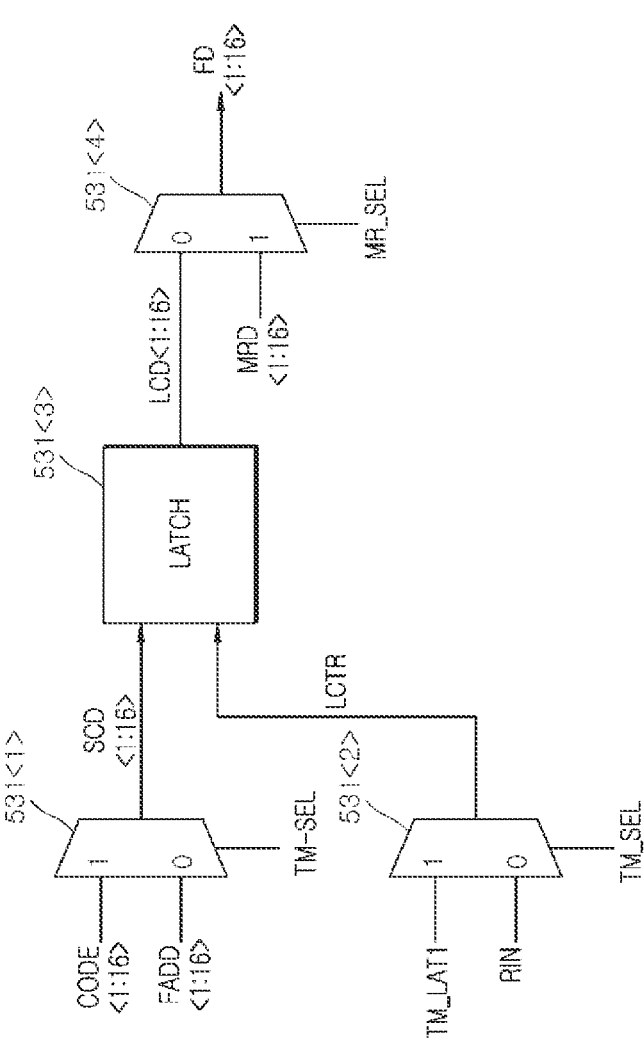

FIG. 13 is a block diagram illustrating a construction according to an example of a fuse data generation circuit that is included in the fuse array circuit illustrated in FIG. 12.

FIG. 14 is a table for describing transmitters and receivers that are activated in a normal operation according to an example of the present disclosure.

FIG. 15 is a table for describing transmitters and receivers that are activated in a training operation according to an example of the present disclosure.

Figure 16:
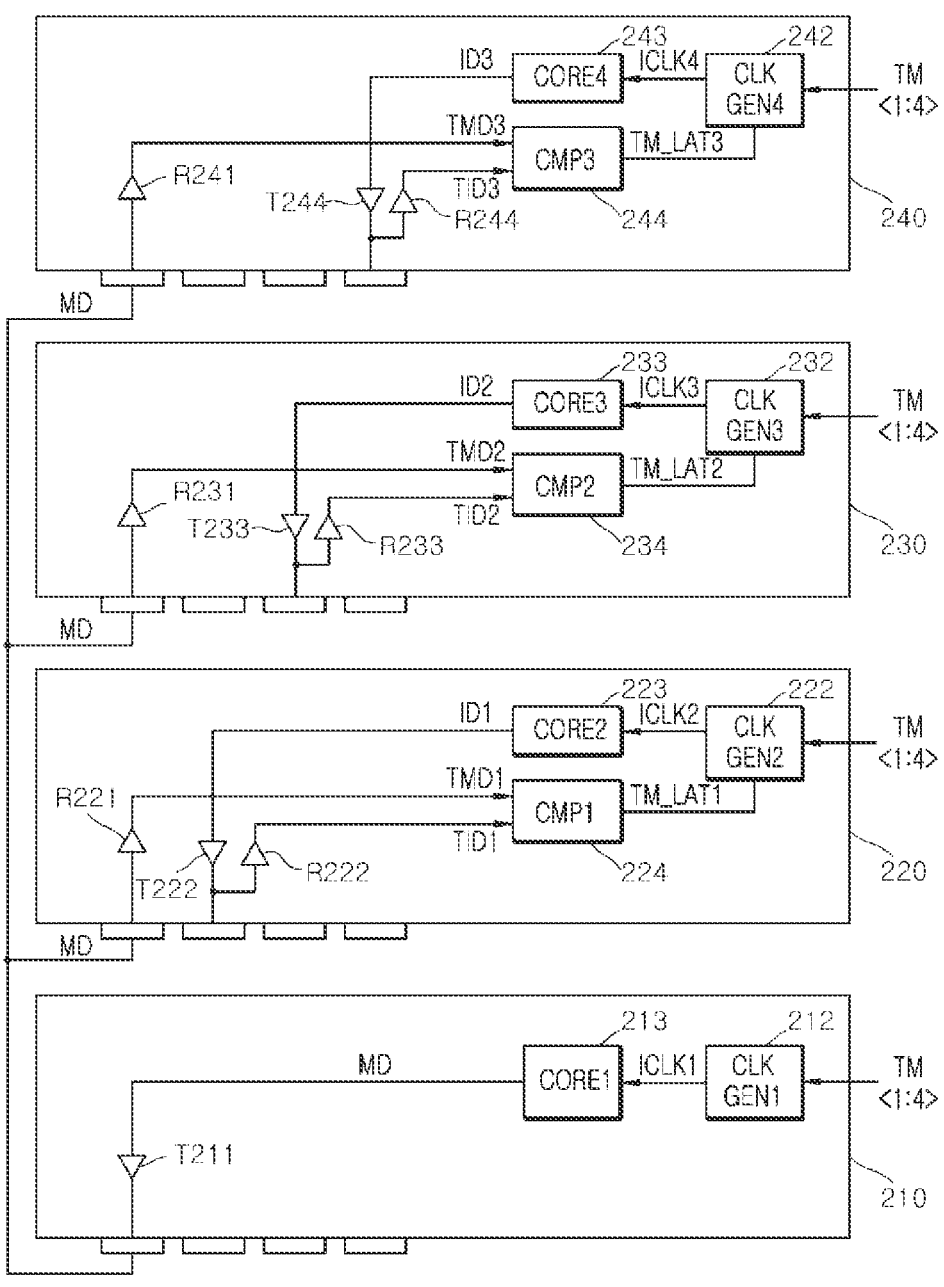

FIG. 16 is a diagram for describing an operation of performing, by a semiconductor device, a training operation according to an example of the present disclosure.

Figure 17:
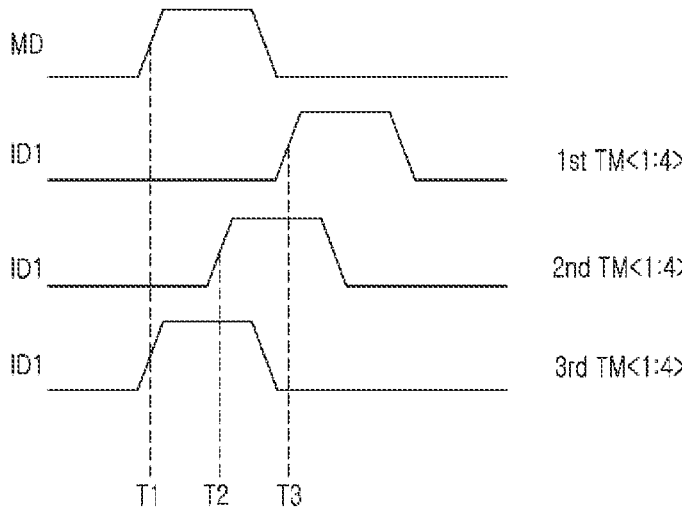
Figure 18:
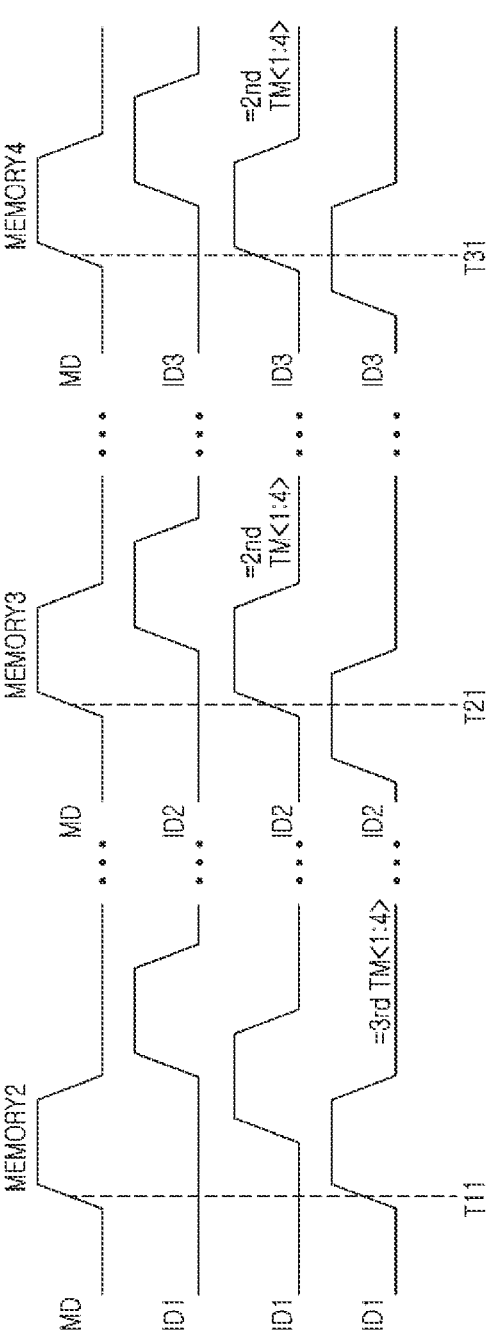

FIGS. 17 and 18 are timing diagrams for describing a training operation of the semiconductor package according to an example of the present disclosure.

Figure 19:
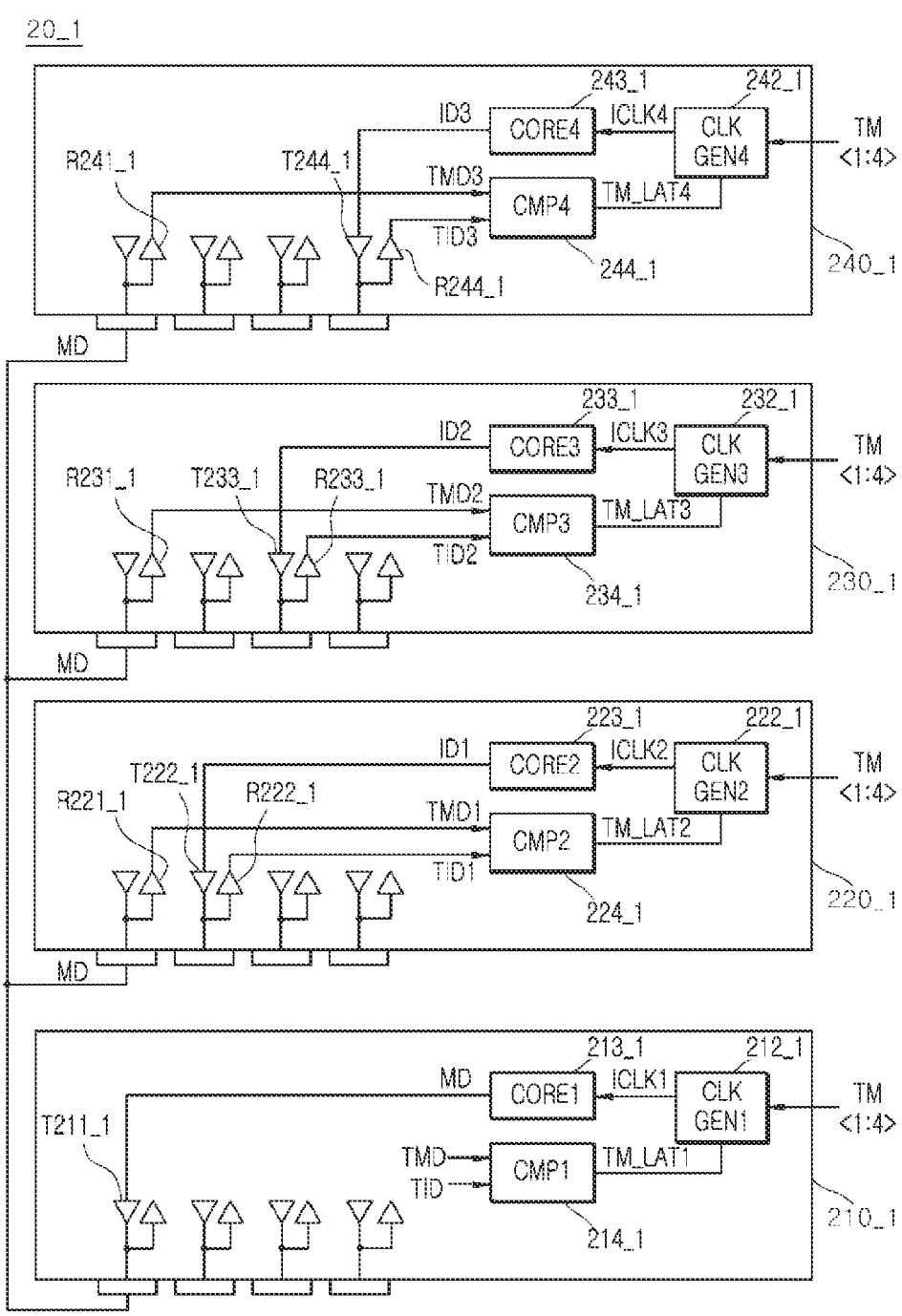

FIG. 19 is a diagram for describing a block that is activated after the start of a training operation of a semiconductor device according to an example of the present disclosure.

Figure 1:
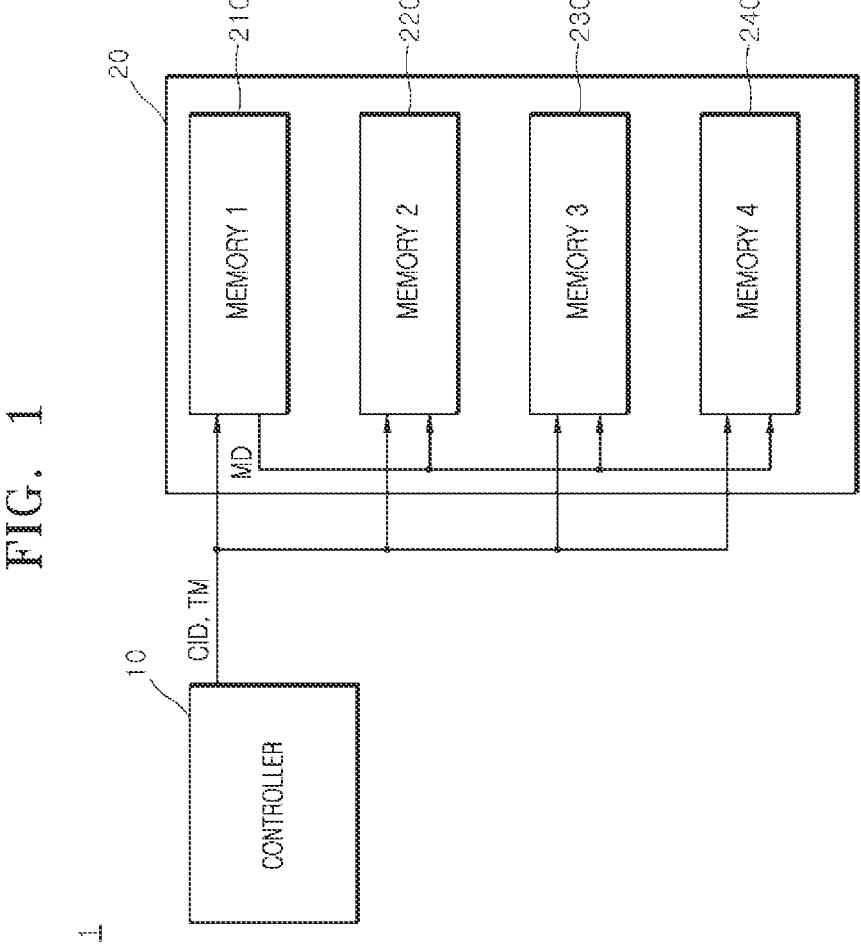
FIG. 1 is a block diagram illustrating a construction of a semiconductor package according to an example of the present disclosure.
Figure 20:
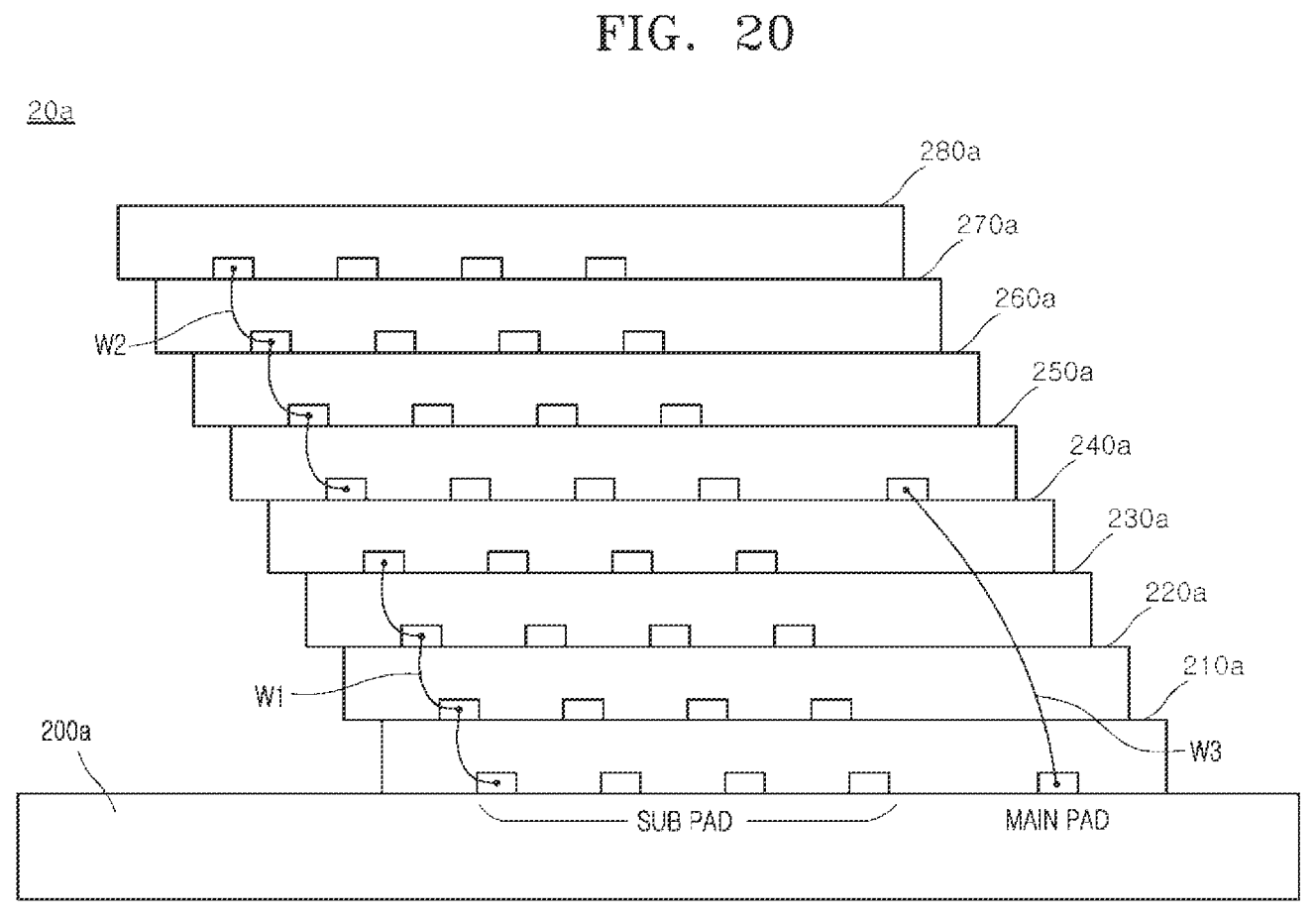

FIG. 20 is a diagram illustrating a cross-sectional structure according to an example of a semiconductor device of the present disclosure illustrated in FIG. 1.

Figure 21:
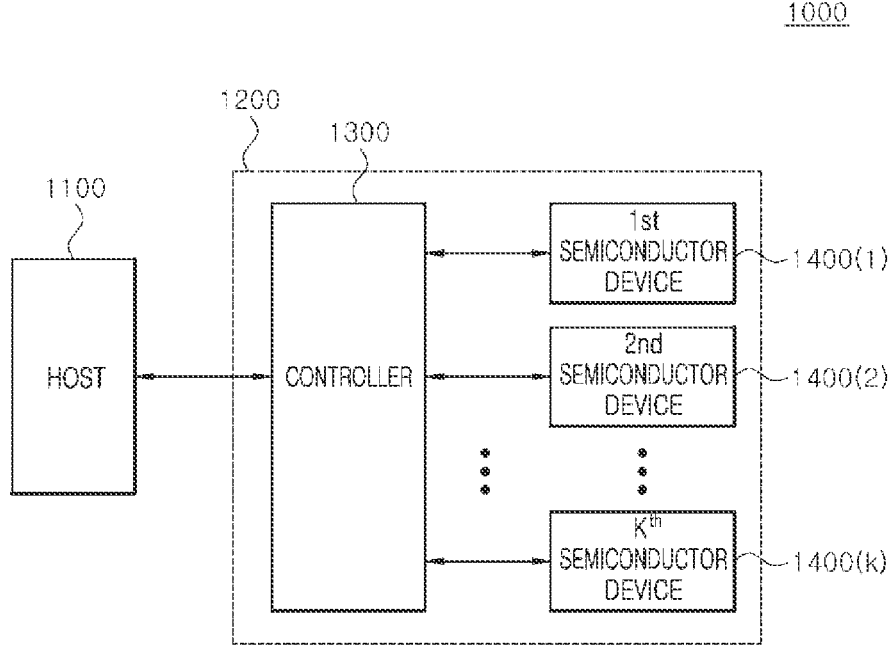

FIG. 21 is a diagram illustrating a construction according to an embodiment of an electronic system to which the semiconductor package illustrated in FIGS. 1 to 20 has been applied.

DETAILED DESCRIPTION

In the descriptions of the following examples, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the teachings of the present disclosure will be described in more detail through embodiments. The embodiments are only used to exemplify the teachings of the present disclosure, and the scope of the present disclosure is not limited by the embodiments.

The present disclosure provides a semiconductor package for programming a test code when time points at which master data that are output by one of multiple memory devices and internal data that is generated within the remaining memory devices are identical after the start of a training operation.

According to the present disclosure, operating speeds of multiple memory devices can be adjusted to be identical by programming a test code when time points at which master data that are output by one of multiple memory devices and internal data that is generated within the remaining memory devices are identical after the start of a training operation.

Furthermore, according to the present disclosure, an error of data input and output operations in a normal operation can be prevented by adjusting operating speeds of multiple memory devices to be identical by programming a test code when time points at which data that are output by the multiple memory devices is input are identical after the start of a training operation.

FIG. 1 is a block diagram illustrating a construction of a semiconductor package 1 according to an example of the present disclosure. As illustrated in FIG. 1, the semiconductor package 1 may include a controller 10 and a semiconductor device 20. The semiconductor device 20 may include a first memory device 210, a second memory device 220, a third memory device 230, and a fourth memory device 240.

The controller 10 may output a chip ID CID and a test code TM for performing a training operation to the first memory device 210, the second memory device 220, the third memory device 230, and the fourth memory device 240. The controller 10 may output a command (not illustrated) and an address (not illustrated) for performing a normal operation to the first memory device 210, the second memory device 220, the third memory device 230, and the fourth memory device 240. The controller 10 may output data (not illustrated) for performing the normal operation to the first memory device 210, the second memory device 220, the third memory device 230, and the fourth memory device 240. The controller 10 may receive data (not illustrated) from the first memory device 210, the second memory device 220, the third memory device 230, and the fourth memory device 240 in the normal operation. The training operation may be set as an operation that adjusts operating speeds of the first memory device 210, the second memory device 220, the third memory device 230, and the fourth memory device 240 to be equal by adjusting time points at which data that are input to and output by the first memory device 210, the second memory device 220, the third memory device 230, and the fourth memory device 240 to be identical. The normal operation may include a common write operation, read operation, refresh operation, etc.

The first memory device 210 may be implemented as a master device. The first memory device 210 may be activated by a chip ID CID after the start of a training operation and may output master data MD to the second memory device 220, the third memory device 230, and the fourth memory device 240.

The second memory device 220 may be implemented as a slave device. The second memory device 220 may be activated by a chip ID CID after the start of a training operation and may store a test code TM when time points at which master data MD and internal data (not illustrated) that are output within the second memory device 220 are output becomes identical. The second memory device 220 may program a test code TM that is stored when the training operation is terminated. Based on the programmed test code TM, the second memory device 220 may adjust a time point at which the internal data (not illustrated) is output.

The third memory device 230 may be implemented as a slave device. The third memory device 230 may be activated by a chip ID CID after the start of a training operation and may store a test code TM when time points at which master data MD and internal data (not illustrated) that are output within the third memory device 230 are output become identical. The third memory device 230 may program a test code TM that is stored when the training operation is terminated. Based on the programmed test code TM, the third memory device 230 may adjust a time point at which the internal data (not illustrated) is output.

The fourth memory device 240 may be implemented as a slave device. The fourth memory device 240 may be activated by a chip ID CID after the start of a training operation and may store a test code TM when time points at which master data MD and internal data (not illustrated) that are output within the fourth memory device 240 are output become identical. The fourth memory device 240 may program a test code TM that is stored when the training operation is terminated. Based on the programmed test code TM, the fourth memory device 240 may adjust a time point at which the internal data (not illustrated) is output.

Operating speeds of the first memory device 210, the second memory device 220, the third memory device 230, and the fourth memory device 240 may be differently set based on a PVT variation.

The controller 10 and the semiconductor device 20 shown in FIG. 1 are included in one package, but in other embodiments, the controller 10 and the semiconductor device 20 may be configured as separate packages.

Figure 2:
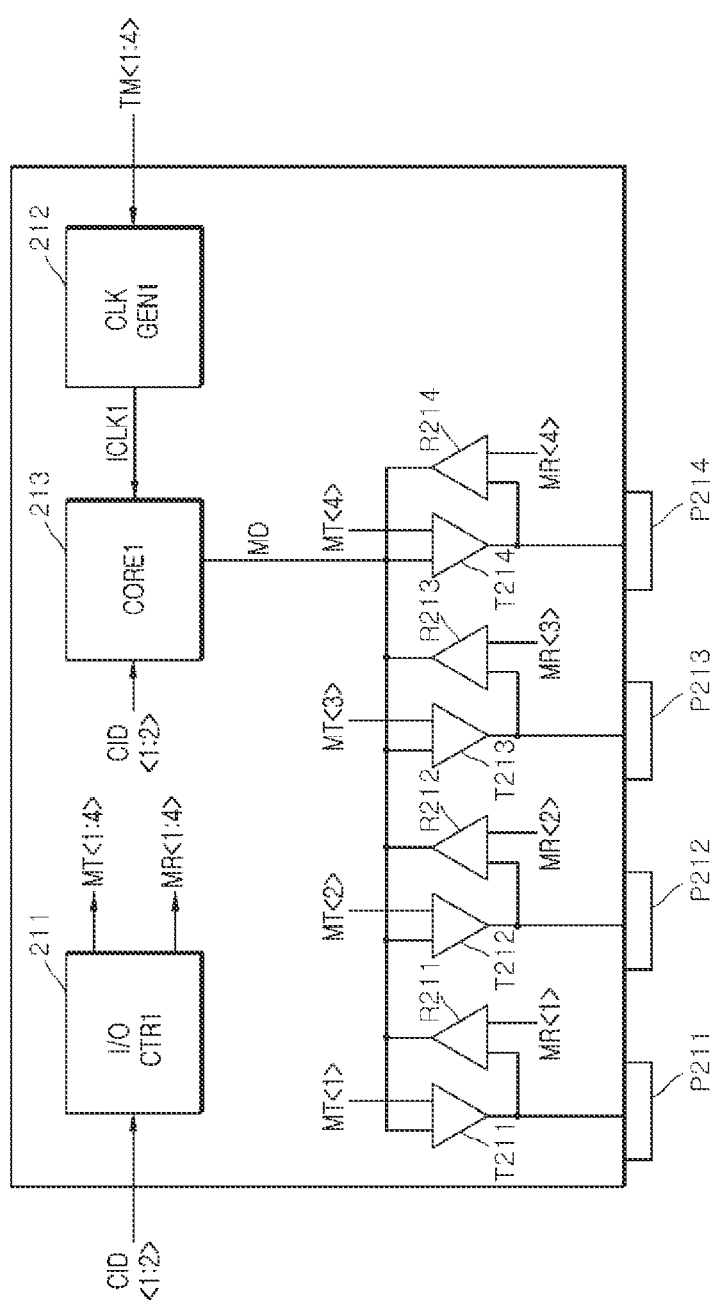
FIG. 2 is a block diagram illustrating a construction according to an example of a first memory device that is included in a semiconductor device illustrated in FIG. 1.

FIG. 2 is a block diagram illustrating a construction according to an embodiment of the first memory device 210. As illustrated in FIG. 2, the first memory device 210 may include a first input/output control circuit (I/O CTR1) 211, a first clock generation circuit (CLK GEN1) 212, a first core circuit (CORE1) 213, first to fourth master transmitters T211 to T214, first to fourth master receivers R211 to R214, and first to fourth master pads P211 to P214.

The first input/output control circuit 211 may generate first to fourth master transmission control signals MT<1:4> and first to fourth master reception control signals MR<1:4> that are selectively enabled based on first and second chip IDs CID<1:2> that are input after the start of a normal operation. Combinations of logic levels of the first and second chip IDs CID<1:2> that are input after the start of the normal operation are specifically described with reference to FIG. 3.

The first clock generation circuit 212 may generate a first internal clock ICLK1 based on the first to fourth test codes TM<1:4> after the start of a training operation. The first clock generation circuit 212 may generate the first internal clock ICLK1 with a fixed delay when first to fourth test codes TM<1:4> are input after the start of the training operation.

The first core circuit 213 may be activated by the first and second chip IDs CID<1:2> after the start of a training operation and may output master data MD that has been stored in the first core circuit 213 in synchronization with the first internal clock ICLK1. The first core circuit 213 may be activated by the first and second chip IDs CID<1:2> after the start of a write operation of a normal operation and may store the master data MD in synchronization with the first internal clock ICLK1. The first core circuit 213 may be activated by the first and second chip IDs CID<1:2> after the start of a read operation of a normal operation and may output the master data MD that has been stored in the first core circuit 213 in synchronization with the first internal clock ICLK1. The first core circuit 213 may be implemented as a common core circuit and may include a command decoder, an address decoder, a data input/output control circuit, etc. that are activated by the first and second chip IDs CID<1:2>. The command decoder, the address decoder, the data input/output control circuit, etc. that are included in the first core circuit 213 may be activated by the first and second chip IDs CID<1:2> having the same logic level combination after the start of a training operation. The command decoder, the address decoder, the data input/output control circuit, etc. that are included in the first core circuit 213 may be activated by the first chip ID CID<1> having a logic low level and the second chip ID CID<2> having a logic low level after the start of a normal operation.

The first master transmitter T211 and the first master receiver R211 may be connected to the first master pad P211. The first master transmitter T211 may be activated when the first master transmission control signal MT<1> is enabled and may output the master data MD through the first master pad P211. The first master receiver R211 may be activated when the first master reception control signal MR<1> is enabled and may generate the master data MD by receiving data from the first master pad P211.

The second master transmitter T212 and the second master receiver R212 may be connected to the second master pad P212. The second master transmitter T212 may be activated when the second master transmission control signal MT<2> is enabled and may output the master data MD through the second master pad P212. The second master receiver R212 may be activated when the second master reception control signal MR<2> is enabled and may generate the master data MD by receiving data from the second master pad P212.

The third master transmitter T213 and the third master receiver R213 may be connected to the third master pad P213. The third master transmitter T213 may be activated when the third master transmission control signal MT<3> is enabled and may output the master data MD through the third master pad P213. The third master receiver R213 may be activated when the third master reception control signal MR<3> is enabled and may generate the master data MD by receiving data from the third master pad P213.

The fourth master transmitter T214 and the fourth master receiver R214 may be connected to the fourth master pad P214. The fourth master transmitter T214 may be activated when the fourth master transmission control signal MT<4> is enabled and may output the master data MD through the fourth master pad P214. The fourth master receiver R214 may be activated when the fourth master reception control signal MR<4> is enabled and may generate the master data MD by receiving data from the fourth master pad P214.

FIG. 3 is a table for describing logic levels of the first and second chip IDs CID<1:2> after the start of a normal operation and a training operation according to an example.

After the start of a normal operation, in order to activate the first memory chip 210, the logic level of the first chip ID CID<1> may be input as a logic low level L, and the logic level of the second chip ID CID<2> may be input as a logic low level L. After the start of the normal operation, in order to activate the second memory chip 220, the logic level of the first chip ID CID<1> may be input as a logic high level H, and the logic level of the second chip ID CID<2> may be input as a logic low level L. After the start of the normal operation, in order to activate the third memory chip 230, the logic level of the first chip ID CID<1> may be input as a logic low level L, and the logic level of the second chip ID CID<2> may be input as a logic high level H. After the start of the normal operation, in order to activate the fourth memory chip 240, the logic level of the first chip ID CID<1> may be input as a logic high level H, and the logic level of the second chip ID CID<2> may be input as a logic high level H.

After the start of the normal operation, in order to selectively activate the first to fourth memory chips 210 to 240, the logic levels of the first and second chip IDs CID<1:2> may be input as different logic level combinations.

After the start of a training operation, in order to activate the first memory chip 210, the logic level of the first chip ID CID<1> may be input as a logic low level L, and the logic level of the second chip ID CID<2> may be input as a logic low level L. After the start of the training operation, in order to activate the second memory chip 220, the logic level of the first chip ID CID<1> may be input as a logic low level L, and the logic level of the second chip ID CID<2> may be input as a logic low level L. After the start of the training operation, in order to activate the third memory chip 230, the logic level of the first chip ID CID<1> may be input as a logic low level L, and the logic level of the second chip ID CID<2> may be input as a logic low level L. After the start of the training operation, in order to activate the fourth memory chip 240, the logic level of the first chip ID CID<1> may be input as a logic low level L, and the logic level of the second chip ID CID<2> may be input as a logic low level L.

After the start of the training operation, in order to activate all of the first to fourth memory chips 210 to 240, the logic levels of the first and second chip IDs CID<1:2> may be input as the same logic level combination.

Figure 4:
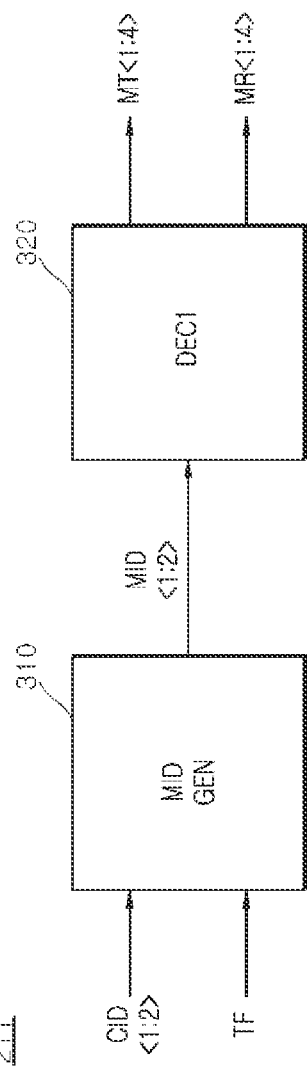
FIG. 4 is a block diagram illustrating a construction according to an example of a first input/output control circuit that is included in the first memory device illustrated in FIG. 2.

FIG. 4 is a block diagram illustrating a construction according to an embodiment of the first input/output control circuit 211. As illustrated in FIG. 4, the first input/output control circuit 211 may include a master ID generation circuit (MID GEN) 310 and a first decoder 320 (DEC1).

The master ID generation circuit 310 may receive the first and second chip IDs CID<1:2> after the start of a normal operation. The master ID generation circuit 310 may receive the first and second chip IDs CID<1:2> when a training flag signal TF is disabled after the start of a normal operation. The master ID generation circuit 310 may generate first and second master IDs MID<1:2> by latching the first and second chip IDs CID<1:2> that have been input in a normal operation after the start of a training operation. The master ID generation circuit 310 may generate the first and second master IDs MID<1:2> by latching the first and second chip IDs CID<1:2> that have been input in a normal operation when the training flag signal TF is enabled after the start of a training operation.

The first decoder 320 may generate the first to fourth master transmission control signals MT<1:4> by decoding the first and second master IDs MID<1:2>. The first decoder 320 may generate the first to fourth master reception control signals MR<1:4> by decoding the first and second master IDs MID<1:2>.

Figure 5:
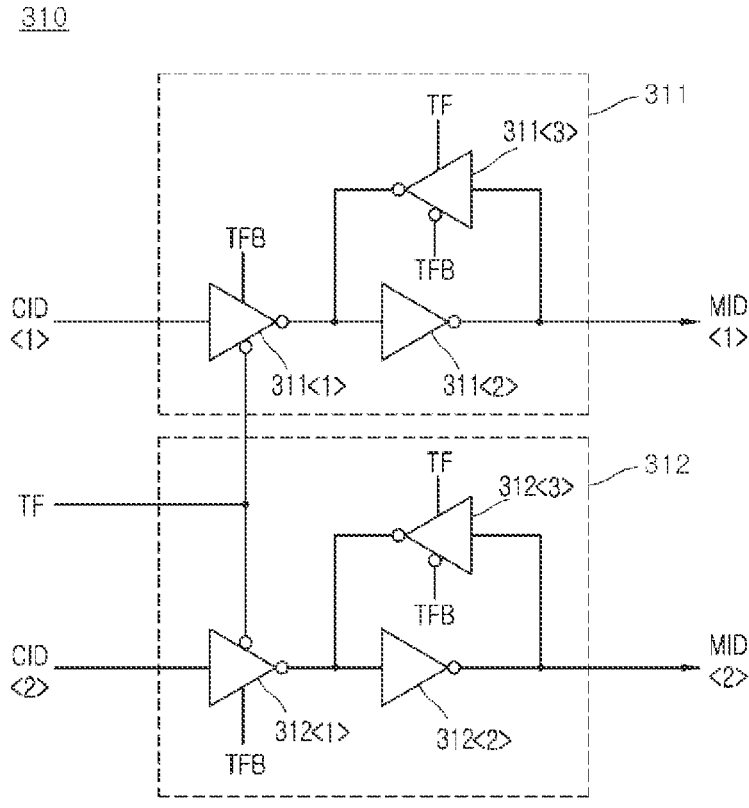
FIG. 5 is a circuit diagram illustrating a construction according to an example of a master ID generation circuit that is included in the first input/output control circuit illustrated in FIG. 4.

FIG. 5 is a circuit diagram illustrating a construction according to an embodiment of the master ID generation circuit 310. As illustrated in FIG. 5, the master ID generation circuit 310 may include a first master ID generation circuit 311 and a second master ID generation circuit 312.

The first master ID generation circuit 311 may be implemented as inverters 311<1>, 311<2>, and 311<3>. The inverter 311<1> may receive the first chip ID CID<1> when the logic level of the training flag signal TF is disabled to a logic low level after the start of a normal operation. The inverter 311<1> may invert and output the first chip ID CID<1> that is input after the start of the normal operation. The inverters 311<2> and 311<3> may be implemented as a latch in which the input stages and output stages of the inverters 311<2> and 311<3> are connected. The inverter 311<2> may invert the output signal of the inverter 311<1> and may output the inverted signal as the first master ID MID<1>. The inverters 311<2> and 311<3> may latch the output signal of the inverter 311<1> when the logic level of the training flag signal TF is enabled to a logic high level after the start of a training operation. The inverted training flag signal TFB may be set as a signal that has been inverted from the training flag signal TF.

The second master ID generation circuit 312 may be implemented as inverters 312<1>, 312<2>, and 312<3>. The inverter 312<1> may receive the second chip ID CID<2> when the logic level of the training flag signal TF is disabled to a logic low level after the start of a normal operation. The inverter 312<1> may invert and output the second chip ID CID<2> that is input after the start of a normal operation. The inverters 312<2> and 312<3> may be implemented as a latch in which the input stages and output stages of the inverters 312<2> and 312<3> are connected. The inverter 312<2> may invert the output signal of the inverter 312<1> after the start of a training operation and may output the inverted signal as the second master ID MID<2>. The inverters 312<2> and 312<3> may latch the output signal of the inverter 312<1> when the logic level of the training flag signal TF is enabled to a logic high level after the start of a training operation.

Figure 6:
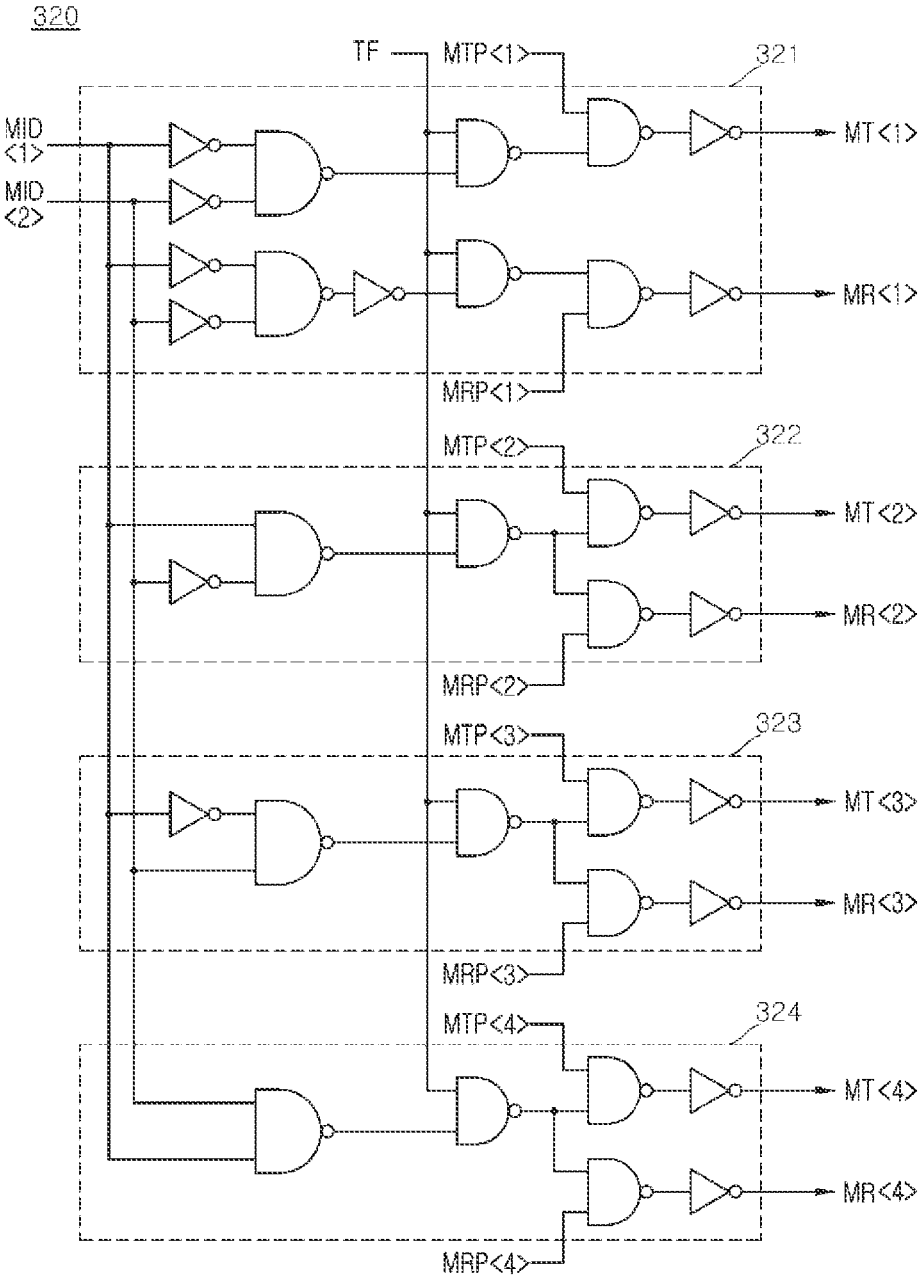
FIG. 6 is a circuit diagram illustrating a construction according to an example of a first decoder that is included in the first input/output control circuit illustrated in FIG. 4.

FIG. 6 is a circuit diagram illustrating a construction according to an embodiment of the first decoder 320. As illustrated in FIG. 6, the first decoder 320 may include a first logic circuit 321, a second logic circuit 322, a third logic circuit 323, and a fourth logic circuit 324.

The first logic circuit 321 may generate the first master transmission control signal MT<1> that is enabled to a logic high level when the logic level of the training flag signal TF is enabled to a logic high level after the start of a training operation, the logic level of a first pre-master transmission control signal MTP<1> is input as a logic high level, the logic level of the first master ID MID<1> is input as a logic low level, and the logic level of the second master ID MID<2> is input as a logic low level. The first logic circuit 321 may generate the first master reception control signal MR<1> that is enabled to a logic high level when the logic level of the training flag signal TF is enabled to a logic high level after the start of a training operation, the logic level of a first pre-master reception control signal MRP<1> is input as a logic high level, the logic level of the first master ID MID<1> is input as a logic low level, and the logic level of the second master ID MID<2> is input as a logic low level. The first logic circuit 321 may generate the first master transmission control signal MT<1> that is enabled to a logic high level when the logic level of the first pre-master transmission control signal MTP<1> is input as a logic high level after the start of a normal operation. The first logic circuit 321 may generate the first master reception control signal MR<1> that is enabled to a logic high level when the logic level of the first pre-master reception control signal MRP<1> is input as a logic high level after the start of a normal operation. The first pre-master transmission control signal MTP<1> and the first pre-master reception control signal MRP<1> may be set as a signal that is input as a logic high level after the start of a training operation and that is input as a logic high level when the logic level of the first chip ID CID<1> is a logic low level and the logic level of the second chip ID CID<2> is a logic low level after the start of a normal operation.

The second logic circuit 322 may generate the second master transmission control signal MT<2> that is enabled to a logic high level when the logic level of the training flag signal TF is enabled to a logic high level after the start of a training operation, the logic level of a second pre-master transmission control signal MTP<2> is input as a logic high level, the logic level of the first master ID MID<1> is input as a logic high level, and the logic level of the second master ID MID<2> Is input as a logic low level. The second logic circuit 322 may generate the second master reception control signal MR<2> that is enabled to a logic high level when the logic level of the training flag signal TF is enabled to a logic high level after the start of a training operation, the logic level of a second pre-master reception control signal MRP<2> is input as a logic high level, the logic level of the first master ID MID<1> is input as a logic high level, and the logic level of the second master ID MID<2> is input as a logic low level. The second logic circuit 322 may generate the second master transmission control signal MT<2> that is enabled to a logic high level when the logic level of the second pre-master transmission control signal MTP<2> is input as a logic high level after the start of a normal operation. The second logic circuit 322 may generate the second master reception control signal MR<2> that is enabled to a logic high level when the logic level of the second pre-master reception control signal MRP<2> Is input as a logic high level after the start of a normal operation. The second pre-master transmission control signal MTP<2> and the second pre-master reception control signal MRP<2> may be set as a signal that is input as a logic high level after the start of a training operation and that is input as a logic high level when the logic level of the first chip ID CID<1> is a logic high level and the logic level of the second chip ID CID<2> is a logic low level after the start of a normal operation.

The third logic circuit 323 may generate the third master transmission control signal MT<3> that is enabled to a logic high level when the logic level of the training flag signal TF is enabled to a logic high level after the start of a training operation, the logic level of a third pre-master transmission control signal MTP<3> is input as a logic high level, the logic level of the first master ID MID<1> is input as a logic low level, and the logic level of the second master ID MID<2> is input as a logic high level. The third logic circuit 323 may generate the third master reception control signal MR<3> that is enabled to a logic high level when the logic level of the training flag signal TF is enabled to a logic high level after the start of a training operation, the logic level of a third pre-master reception control signal MRP<3> is input as a logic high level, the logic level of the first master ID MID<1> is input as a logic low level, and the logic level of the second master ID MID<2> is input as a logic high level. The third logic circuit 323 may generate the third master transmission control signal MT<3> that is enabled to a logic high level when the logic level of the third pre-master transmission control signal MTP<3> is input as a logic high level after the start of a normal operation. The third logic circuit 323 may generate the third master reception control signal MR<3> that is enabled to a logic high level when the logic level of the third pre-master reception control signal MRP<3> is input as a logic high level after the start of a normal operation. The third pre-master transmission control signal MTP<3> and the third pre-master reception control signal MRP<3> may be set as a signal that is input as a logic high level after the start of a training operation and that is input as a logic high level when the logic level of the first chip ID CID<1> is a logic low level and the logic level of the second chip ID CID<2> is a logic high level after the start of a normal operation.

The fourth logic circuit 324 may generate the fourth master transmission control signal MT<4> that is enabled to a logic high level when the logic level of the training flag signal TF is enabled to a logic high level after the start of a training operation, the logic level of a fourth pre-master transmission control signal MTP<4> is input as a logic high level, the logic level of the first master ID MID<1> is input as a logic high level, and the logic level of the second master ID MID<2> is input as a logic high level. The fourth logic circuit 324 may generate the fourth master reception control signal MR<4> that is enabled to a logic high level when the logic level of the training flag signal TF is enabled to a logic high level after the start of a training operation, the logic level of a fourth pre-master reception control signal MRP<4> is input as a logic high level, the logic level of the first master ID MID<1> is input as a logic high level, and the logic level of the second master ID MID<2> is input as a logic high level. The fourth logic circuit 324 may generate the fourth master transmission control signal MT<4> that is enabled to a logic high level when the logic level of the fourth pre-master transmission control signal MTP<4> is input as a logic high level after the start of a normal operation. The fourth logic circuit 324 may generate the fourth master reception control signal MR<4> that is enabled to a logic high level when the logic level of the fourth pre-master reception control signal MRP<4> is input as a logic high level after the start of a normal operation. The fourth pre-master transmission control signal MTP<4> and the fourth pre-master reception control signal MRP<4> may be set as a signal that is input as a logic high level after the start of a training operation and that is input as a logic high level when the logic level of the first chip ID CID<1> is a logic high level and the logic level of the second chip ID CID<2> is a logic high level after the start of a normal operation.

Figure 7:
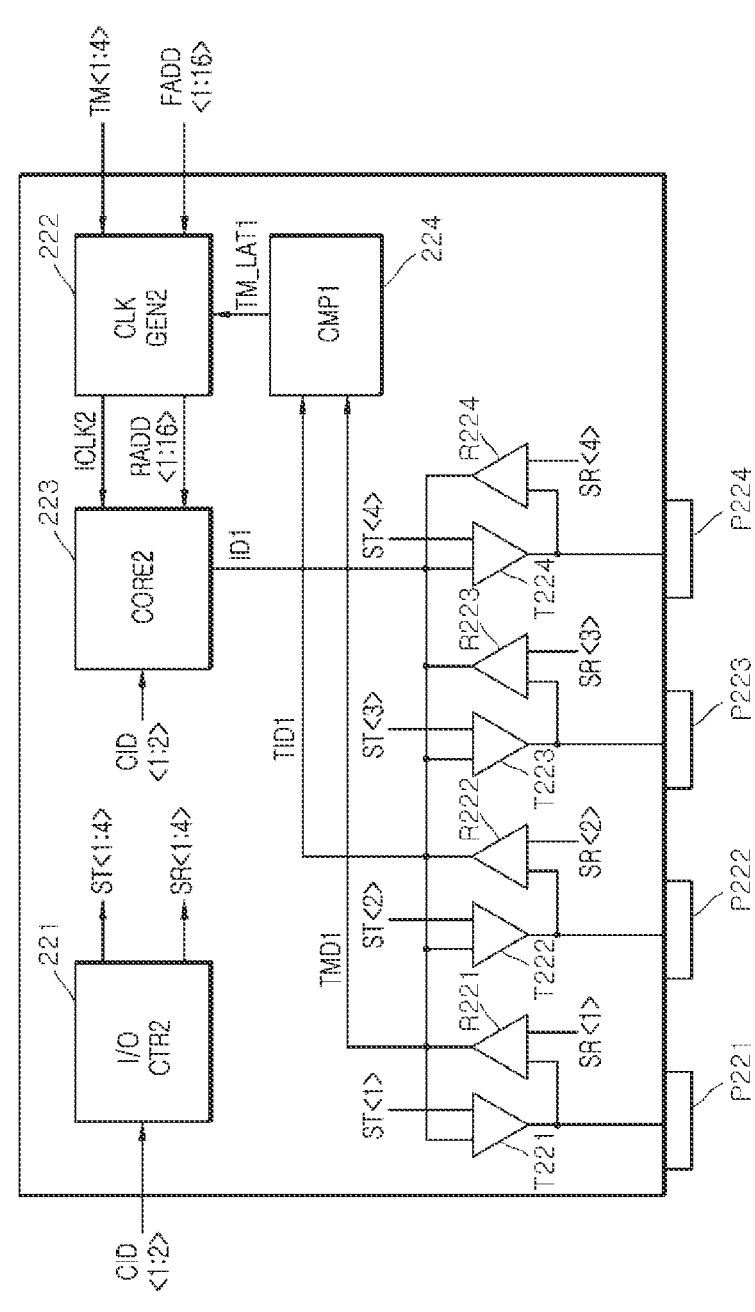
FIG. 7 is a block diagram illustrating a construction according to an example of a second memory device that is included in the semiconductor device illustrated in FIG. 1.

FIG. 7 is a block diagram illustrating a construction according to an embodiment of the second memory device 220. As illustrated in FIG. 7, the second memory device 220 may include a second input/output control circuit (I/O CTR2) 221, a second clock generation circuit (CLK GEN2) 222, a second core circuit (CORE2) 223, a first comparison circuit (CMP1) 224, first to fourth slave transmitters T221 to T224, first to fourth slave receivers R221 to R224, and first to fourth slave pads P221 to P224.

The second input/output control circuit 221 may generate first to fourth slave transmission control signals ST<1:4> and first to fourth slave reception control signals SR<1:4> that are selectively enabled based on the first and second chip IDs CID<1:2> that are input after the start of a normal operation.

The second clock generation circuit 222 may generate a second internal clock ICLK2 based on the first to fourth test codes TM<1:4> after the start of a training operation. The second clock generation circuit 222 may generate the second internal clock ICLK2 with a delay that is adjusted based on a combination of logic levels of the first to fourth test codes TM<1:4> after the start of a training operation. The first to fourth test codes TM<1:4> may be sequentially counted after the start of a training operation. For example, the logic levels of the first to fourth test codes TM<1:4> may be generated as "L, L, L, L" after the start of the first training operation, the logic levels of the first to fourth test codes TM<1:4> may be generated as "L, L, L, H" after the start of the second training operation, the logic levels of the first to fourth test codes TM<1:4> may be generated as "L, L, H, L" after the start of the third training operation. The second clock generation circuit 222 may store the first to fourth test codes TM<1:4> when a first test latch signal TM_LAT1 is enabled after the start of a training operation. The second clock generation circuit 222 may program the first to fourth test codes TM<1:4> that are stored when the training operation is terminated. The second clock generation circuit 222 may generate the second internal clock ICLK2 having a delay that has been adjusted based on the programmed first to fourth test codes TM<1:4>, after the start of a normal operation. The second clock generation circuit 222 may program first to sixteenth failure addresses FADD<1:16> after the start of a normal operation and may output the programmed first to sixteenth failure addresses FADD<1:16> as first to sixteenth repair addresses RADD<1:16>. The second clock generation circuit 222 may output the first to sixteenth failure addresses FADD<1:16> as the first to sixteenth repair addresses RADD<1:16> after the start of a normal operation.

The second core circuit 223 may be activated by the first and second chip IDs CID<1:2> after the start of a training operation and may output first internal data ID1 that has been stored in the second core circuit 223 in synchronization with the second internal clock ICLK2. The second core circuit 223 may be activated by the first and second chip IDs CID<1:2> after the start of a write operation of a normal operation and may store the first internal data ID1 in synchronization with the second internal clock ICLK2. The second core circuit 223 may be activated by the first and second chip IDs CID<1:2> after the start of a read operation of a normal operation and may output the first internal data ID1 that has been stored in the second core circuit 223 in synchronization with the second internal clock ICLK2. The second core circuit 223 may perform a repair operation of replacing an area in which an error has occurred based on the first to sixteenth repair addresses RADD<1:16> after the start of a normal operation. The second core circuit 223 may perform a write operation and a read operation through an area that has been replaced based on the first to sixteenth repair addresses RADD<1:16> after the start of a normal operation. The second core circuit 223 may be implemented as a common core circuit and may include a command decoder, an address decoder, a data input/output control circuit, etc. that are activated by the first and second chip IDs CID<1:2>. The command decoder, the address decoder, the data input/output control circuit, etc. that are included in the second core circuit 223 may be activated by the first and second chip IDs CID<1:2> having the same logic level combination after the start of a training operation. The command decoder, the address decoder, the data input/output control circuit, etc. that are included in the second core circuit 223 may be activated by the first chip ID CID<1> having a logic high level and the second chip ID CID<2> having a logic low level after the start of a normal operation.

The first comparison circuit 224 may generate the first test latch signal TM_LAT1 by sampling a first transfer internal data TID1 based on first transfer master data TMD1 after the start of a training operation. The first comparison circuit 224 may generate the first test latch signal TM_LAT1 by comparing a time point at which the first transfer master data TMD1, received from the first slave receiver R221, are input to a time point at which the first transfer internal data TID1, received from the second slave receiver R222, are input after the start of a training operation.

The first slave transmitter T221 and the first slave receiver R221 may be connected to the first slave pad P221. The first slave transmitter T221 may be activated when the first slave transmission control signal ST<1> is enabled and may output the first internal data ID1 through the first slave pad P221. The first slave receiver R221 may be activated when the first slave reception control signal SR<1> is enabled after the start of a normal operation and may generate the first internal data ID1 by receiving data from the first slave pad P221. The first slave receiver R221 may output the first internal data ID1 to the second core circuit 223 after the start of a normal operation. The first slave receiver R221 may be activated when the first slave reception control signal SR<1> is enabled after the start of a training operation and may generate the first transfer master data TMD1 by receiving the master data MD from the first slave pad P221. The first slave receiver R221 may output the first transfer master data TMD1 to the first comparison circuit 224 after the start of a training operation. In FIG. 7, the first slave receiver R221 has been implemented to generate the first internal data ID1 and the first transfer master data TMD1. However, a switch (not illustrated) may be connected to the first slave receiver R221 and may be implemented to output the first internal data ID1 to the second core circuit 223 after the start of a normal operation and to output the first transfer master data TMD1 to the first comparison circuit 224 after the start of a training operation.

The second slave transmitter T222 and the second slave receiver R222 may be connected to the second slave pad P222. The second slave transmitter T222 may be activated when the second slave transmission control signal ST<2> is enabled and may output the first internal data ID1 through the second slave pad P222. The second slave receiver R222 may be activated when the second slave reception control signal SR<2> is enabled after the start of a normal operation and may generate the first internal data ID1 by receiving data from the second slave pad P222. The second slave receiver R222 may output the first internal data ID1 to the second core circuit 223 after the start of a normal operation. The second slave receiver R222 may be activated when the second slave reception control signal SR<2> is enabled after the start of a training operation and may generate the first transfer internal data TID1 by receiving the first internal data ID1 from the second slave pad P222. The second slave receiver R222 may output the first transfer internal data TID1 to the first comparison circuit 224 after the start of a training operation. In FIG. 7, the second slave receiver R222 has been implemented to generate the first internal data ID1 and the first transfer internal data TID1. However, a switch (not illustrated) may be connected to the second slave receiver R222 and may be implemented to output the first internal data ID1 to the second core circuit 223 after the start of a normal operation and to output the first transfer internal data TID1 to the first comparison circuit 224 after the start of a training operation. The third slave transmitter T223 and the third slave receiver R223 may be connected to the third slave pad P223. The third slave transmitter T223 may be activated when the third slave transmission control signal ST<3> is enabled and may output the first internal data ID1 through the third slave pad P223. The third slave receiver R223 may be activated when the third slave reception control signal SR<3> is enabled and may generate the first internal data ID1 by receiving data from the third slave pad P223.

The fourth slave transmitter T224 and the fourth slave receiver R224 may be connected to the fourth slave pad P224. The fourth slave transmitter T224 may be activated when the fourth slave transmission control signal ST<4> is enabled and may output the first internal data ID1 through the fourth slave pad P224. The fourth slave receiver R224 may be activated when the fourth slave reception control signal SR<4> is enabled and may generate the first internal data ID1 by receiving data from the fourth slave pad P224.

The third memory device 230 and the fourth memory device 240 may be implemented as the same circuits as the second memory device 220, illustrated in FIG. 7, and may perform the same operations as that of the second memory device 220, and thus detailed descriptions thereof are omitted.

Figure 8:
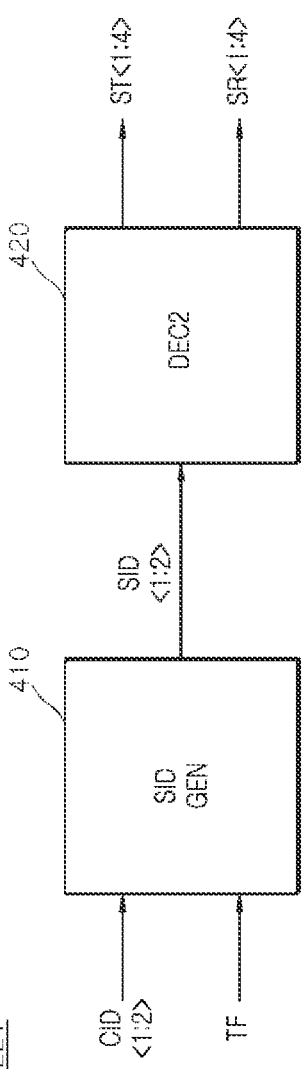
FIG. 8 is a block diagram illustrating a construction according to an example of a second input/output control circuit that is included in the second memory device illustrated in FIG. 7.

FIG. 8 is a block diagram illustrating a construction according to an embodiment of the second input/output control circuit 221. As illustrated in FIG. 8, the second input/output control circuit 221 may include a slave ID generation circuit (SID GEN) 410 and a second decoder (DEC2) 420.

The slave ID generation circuit 410 may receive the first and second chip IDs CID<1:2> after the start of a normal operation. The slave ID generation circuit 410 may receive the first and second chip IDs CID<1:2> when the training flag signal TF is disabled after the start of a normal operation. The slave ID generation circuit 410 may generate first and second slave IDs SID<1:2> by latching the first and second chip IDs CID<1:2> that have been received in a normal operation after the start of a training operation. The slave ID generation circuit 410 may generate the first and second slave IDs SID<1:2> by latching the first and second chip IDs CID<1:2> that have been received in a normal operation when the training flag signal TF is enabled after the start of a training operation.

The second decoder 420 may generate the first to fourth slave transmission control signals ST<1:4> by decoding the first and second slave IDs SID<1:2>. The second decoder 420 may generate the first to fourth slave reception control signal SR<1:4> by decoding the first and second slave IDs SID<1:2>.

Figure 9:
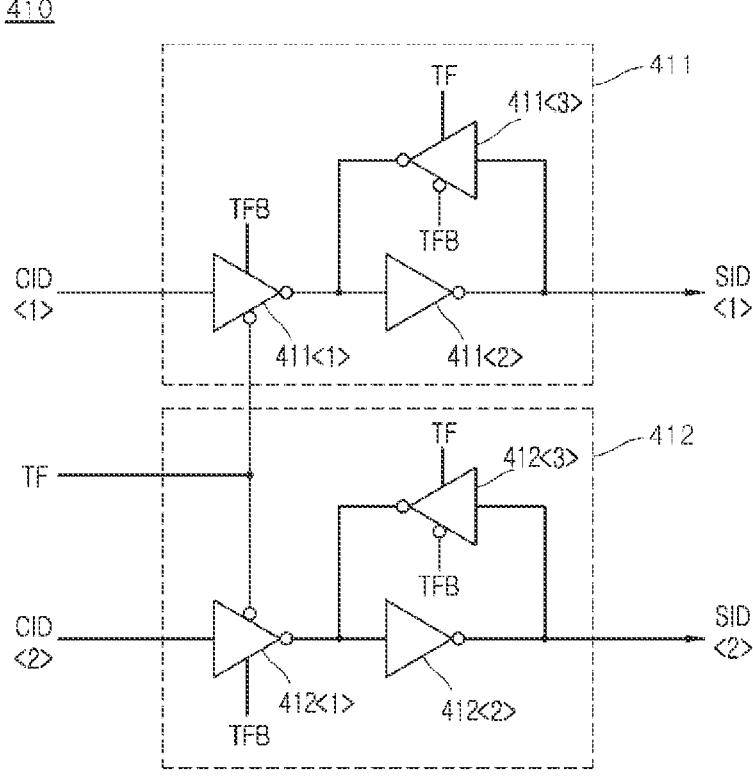
FIG. 9 is a circuit diagram illustrating a construction according to an example of a slave ID generation circuit that is included in the second input/output control circuit illustrated in FIG. 8.

FIG. 9 is a circuit diagram illustrating a construction according to an embodiment of the slave ID generation circuit 410. As illustrated in FIG. 9, the slave ID generation circuit 410 may include a first slave ID generation circuit 411 and a second slave ID generation circuit 412.

The first slave ID generation circuit 411 may be implemented as inverters 411<1>, 411<2>, and 411<3>. The inverter 411<1> may receive the first chip ID CID<1> when the logic level of the training flag signal TF is disabled to a logic low level after the start of a normal operation. The inverter 411<1> may invert and output the first chip ID CID<1> that has been input after the start of a normal operation. The inverters 411<2> and 411<3> may be implemented as a latch in which the input stages and output stages of the inverters 411<2> and 411<3> are connected. The inverter 411<2> may output the first slave ID SID<1> by inverting the output signal of the inverter 411<1>. The inverters 411<2> and 411<3> may latch the output signal of the inverter 411<1> when the logic level of the training flag signal TF is enabled to a logic high level after the start of a training operation.

The second slave ID generation circuit 412 may be implemented as inverters 412<1>, 412<2>, and 412<3>. The inverter 412<1> may receive the second chip ID CID<2> when the logic level of the training flag signal TF is disabled to a logic low level after the start of a normal operation. The inverter 412<1> may invert and output the second chip ID CID<2> that has been input after the start of a normal operation. The inverters 412<2> and 412<3> may be implemented as a latch in which the input stages and output stages of the inverters 412<2> and 412<3> are connected. The inverter 412<2> may invert the output signal of the inverter 412<1> and output the inverted signal as the second slave ID SID<2>, after the start of a training operation. The inverters 412<2> and 412<3> may latch the output signal of the inverter 412<1> when the logic level of the training flag signal TF is enabled to a logic high level after the start of a training operation.

Figure 10:
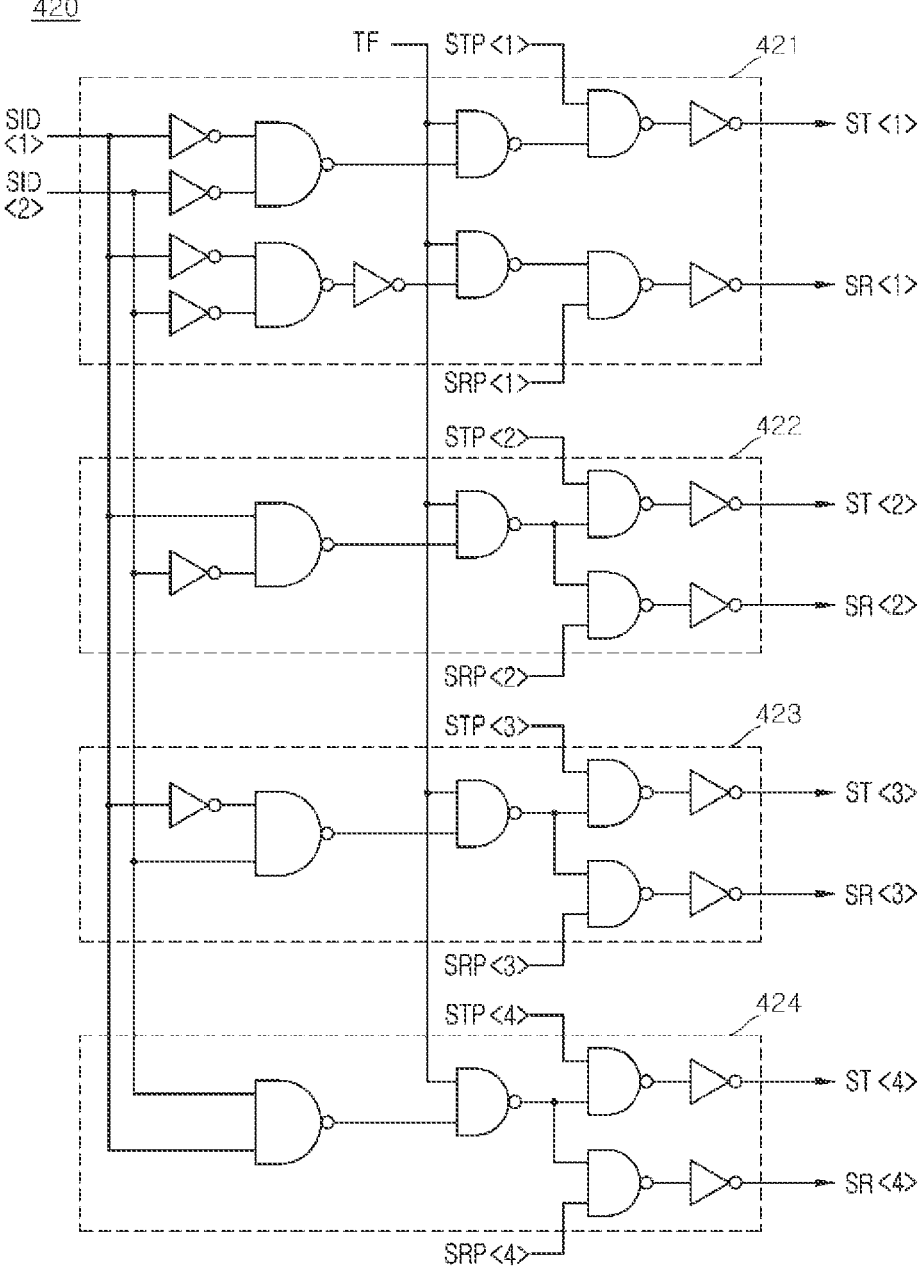
FIG. 10 is a circuit diagram illustrating a construction according to an example of a second decoder that is included in the second input/output control circuit illustrated in FIG. 8.

FIG. 10 is a circuit diagram illustrating a construction according to an embodiment of the second decoder 420. As illustrated in FIG. 10, the second decoder 420 may include a fifth logic circuit 421, a sixth logic circuit 422, a seventh logic circuit 423, and an eighth logic circuit 424.

The fifth logic circuit 421 may generate the first slave transmission control signal ST<1> that is enabled to a logic high level when the logic level of the training flag signal TF is enabled to a logic high level after the start of a training operation, the logic level of a first pre-slave transmission control signal STP<1> is input as a logic high level, the logic level of the first slave ID SID<1> is input as a logic low level, and the logic level of the second slave ID master ID SID<2> is input as a logic low level. The fifth logic circuit 421 may generate the first slave reception control signal SR<1> that is enabled to a logic high level when the logic level of the training flag signal TF is enabled to a logic high level after the start of a training operation, the logic level of a first pre-slave reception control signal SRP<1> is input as a logic high level, the logic level of the first slave ID SID<1> is input as a logic low level, and the logic level of the second slave ID SID<2> is input as a logic low level. The fifth logic circuit 421 may generate the first slave transmission control signal ST<1> that is enabled to a logic high level when the logic level of the first pre-slave transmission control signal STP<1> is input as a logic high level after the start of a normal operation. The fifth logic circuit 421 may generate the first slave reception control signal SR<1> that is enabled to a logic high level when the logic level of the first pre-slave reception control signal SRP<1> is input as a logic high level after the start of a normal operation. The first pre-slave transmission control signal STP<1> and the first pre-slave reception control signal SRP<1> may be set as a signal that is input as a logic high level after the start of a training operation and that is input as a logic high level when the logic level of the first chip ID CID<1> is a logic low level and the logic level of the second chip ID CID<2> is a logic low level after the start of a normal operation.

The sixth logic circuit 422 may generate the second slave transmission control signal ST<2> that is enabled to a logic high level when the logic level of the training flag signal TF is enabled to a logic high level after the start of a training operation, the logic level of a second pre-slave transmission control signal STP<2> is input as a logic high level, the logic level of the first slave ID SID<1> is input as a logic high level, and the logic level of the second slave ID SID<2> is input as a logic low level. The sixth logic circuit 422 may generate the second slave reception control signal SR<2> that is enabled to a logic high level when the logic level of the training flag signal TF is enabled to a logic high level after the start of a training operation, the logic level of a second pre-slave reception control signal SRP<2> is input as a logic high level, the logic level of the first slave ID SID<1> is input as a logic high level, and the logic level of the second slave ID SID<2> is input as a logic low level. The sixth logic circuit 422 may generate the second slave transmission control signal ST<2> that is enabled to a logic high level when the logic level of the second pre-slave transmission control signal STP<2> is input as a logic high level after the start of a normal operation. The sixth logic circuit 422 may generate the second slave reception control signal SR<2> that is enabled to a logic high level when the logic level of the second pre-slave reception control signal SRP<2> is input as a logic high level after the start of a normal operation. The second pre-slave transmission control signal STP<2> and the second pre-slave reception control signal SRP<2> may be set as a signal that is input as a logic high level after the start of a training operation and that is input as a logic high level when the logic level of the first chip ID CID<1> is a logic high level and the logic level of the second chip ID CID<2> is a logic low level after the start of a normal operation.

The seventh logic circuit 423 may generate the third slave transmission control signal ST<3> that is enabled to a logic high level when the logic level of the training flag signal TF is enabled to a logic high level after the start of a training operation, the logic level of a third pre-slave transmission control signal STP<3> is input as a logic high level, the logic level of the first slave ID SID<1> is input as a logic low level, and the logic level of the second slave ID SID<2> is input as a logic high level. The seventh logic circuit 423 may generate the third slave reception control signal SR<3> that is enabled to a logic high level when the logic level of the training flag signal TF is enabled to a logic high level after the start of a training operation, the logic level of a third pre-slave reception control signal SRP<3> is input as a logic high level, the logic level of the first slave ID SID<1> is input as a logic low level, and the logic level of the second slave ID SID<2> is input as a logic high level. The seventh logic circuit 423 may generate the third slave transmission control signal ST<3> that is enabled to a logic high level when the logic level of the third pre-slave transmission control signal STP<3> is input as a logic high level after the start of a normal operation. The seventh logic circuit 423 may generate the third slave reception control signal SR<3> that is enabled to a logic high level when the logic level of the third pre-slave reception control signal SRP<3> is input as a logic high level after the start of a normal operation. The third pre-slave transmission control signal STP<3> and the third pre-slave reception control signal SRP<3> may be set as a signal that is input as a logic high level after the start of a training operation and that is input as a logic high level when the logic level of the first chip ID CID<1> is a logic low level and the logic level of the second chip ID CID<2> is a logic high level after the start of a normal operation.

The eighth logic circuit 424 may generate the fourth slave transmission control signal ST<4> that is enabled to a logic high level when the logic level of the training flag signal TF is enabled to a logic high level after the start of a training operation, the logic level of a fourth pre-slave transmission control signal STP<4> is input as a logic high level, the logic level of the first slave ID SID<1> is input as a logic high level, and the logic level of the second slave ID SID<2> is input as a logic high level. The eighth logic circuit 424 may generate the fourth slave reception control signal SR<4> that is enabled to a logic high level when the logic level of the training flag signal TF is enabled to a logic high level after the start of a training operation, the logic level of a fourth pre-slave reception control signal SRP<4> is input as a logic high level, the logic level of the first slave ID SID<1> is input as a logic high level, and the logic level of the second slave ID SID<2> is input as a logic high level. The eighth logic circuit 424 may generate the fourth slave transmission control signal ST<4> that is enabled to a logic high level when the logic level of the fourth pre-slave transmission control signal STP<4> is input as a logic high level after the start of a normal operation. The eighth logic circuit 424 may generate the fourth slave reception control signal SR<4> that is enabled to a logic high level when the logic level of the fourth pre-slave reception control signal SRP<4> is input as a logic high level after the start of a normal operation. The fourth pre-slave transmission control signal STP<4> and the fourth pre-slave reception control signal SRP<4> may be set as a signal that is input as a logic high level after the start of a training operation and that is input as a logic high level when the logic level of the first chip ID CID<1> is a logic high level and the logic level of the second chip ID CID<2> is a logic high level after the start of a normal operation.

FIG. 11 is a block diagram illustrating a construction according to an embodiment of the second clock generation circuit 222. As illustrated in FIG. 11, the second clock generation circuit 222 may include a code generation circuit (CODE GEN) 510, a DLL circuit (DLL) 520, and a fuse array circuit (ARE) 530.

The code generation circuit 510 may generate first to sixteenth code signals CODE<1:16> by decoding the first to fourth test codes TM<1:4> after the start of a training operation. The code generation circuit 510 may generate the first to sixteenth code signals CODE<1:16> that are selectively enabled by decoding the first to fourth test codes TM<1:4> after the start of a training operation.

The DLL circuit 520 may generate the second internal clock ICLK2 having a delay that is adjusted based on a combination of logic levels of the first to sixteenth code signals CODE<1:16>, after the start of a training operation. For example, after the start of a training operation, the DLL circuit 520 may generate the second internal clock ICLK2 having a delay that is smaller when the second code signal CODE<2> is enabled than when the first code signal CODE<1> is enabled. After the start of a training operation, the DLL circuit 520 may generate the second internal clock ICLK2 having a delay that is set based on a combination of logic levels of the first to sixteenth delay control signals DCTR<1:16>, after the start of a normal operation.

The fuse array circuit 530 may store the first to sixteenth code signals CODE<1:16> when the first test latch signal TM_LAT1 is enabled after the start of a training operation. The fuse array circuit 530 may program the first to sixteenth code signals CODE<1:16> that are stored when the training operation is terminated. The fuse array circuit 530 may output the programmed first to sixteenth code signals CODE<1:16> as first to sixteenth delay control signals DCTR<1:16> after the start of a normal operation. The fuse array circuit 530 may store, in the second core circuit 223, the first to sixteenth failure addresses FADD<1:16> that include location information of an area in which a failure has occurred, after the start of a normal operation. The fuse array circuit 530 may program the first to sixteenth failure addresses FADD<1:16> after the start of a normal operation. The fuse array circuit 530 may output the programmed first to sixteenth failure addresses FADD<1:16> as the first to sixteenth repair addresses RADD<1:16> after the start of a normal operation.

FIG. 12 is a block diagram illustrating a construction according to an embodiment of the fuse array circuit 530. As illustrated in FIG. 12, the fuse array circuit 530 may include a fuse data generation circuit (FD GEN) 531 and a fuse circuit (FUSE) 532.

The fuse data generation circuit 531 may store the first to sixteenth code signals CODE<1:16> when a selection signal TM_SEL and the first test latch signal TM_LAT1 are enabled and may generate first to sixteenth fuse data FD<1:16> from the stored first to sixteenth code signals CODE<1:16>. The fuse data generation circuit 531 may store the first to sixteenth failure addresses FADD<1:16> when the selection signal TM_SEL is disabled and a repair input signal RIN is enabled after the start of a repair operation of a normal operation and may generate the first to sixteenth fuse data FD<1:16> from the stored first to sixteenth failure addresses FADD<1:16>. The fuse data generation circuit 531 may generate the first to sixteenth fuse data FD<1:16> from first to sixteenth mode information signals MRD<1:16> when a mode selection signal MR_SEL is enabled in a mode register write operation. The selection signal TM_SEL may be set as a signal that is enabled after the start of a training operation. The repair input signal RIN may be set as a signal that is enabled after the start of a repair operation of a normal operation. The mode selection signal MR_SEL may be set as a signal that is enabled after the start of a mode register write operation. The first to sixteenth mode information signals MRD<1:16> may be set as a signal that adjusts the delay of the second internal clock ICLK2 based on an external condition.

The fuse circuit 532 may include multiple electrical fuses (not illustrated). The fuse circuit 532 may have the multiple electrical fuses (not illustrated) ruptured when a training operation is terminated and may program the first to sixteenth fuse data FD<1:16>. The fuse circuit 532 may output the programmed first to sixteenth fuse data FD<1:16> as the first to sixteenth delay control signals DCTR<1:16> after the start of a normal operation. The fuse circuit 532 may have the multiple electrical fuses (not illustrated) ruptured after the start of a normal operation and may program the first to sixteenth fuse data FD<1:16>. The fuse circuit 532 may output the programmed first to sixteenth fuse data FD<1:16> as the first to sixteenth repair addresses RADD<1:16> after the start of a normal operation. An operation of the multiple electrical fuses (not illustrated) being ruptured may be set as an operation that programs the first to sixteenth fuse data FD<1:16> by destroying a silicon insulating film that is connected to gates of the multiple electrical fuses (not illustrated) by applying a high voltage to the multiple electrical fuses (not illustrated).

FIG. 13 is a block diagram illustrating a construction according to an embodiment of the fuse data generation circuit 531. As illustrated in FIG. 13, the fuse data generation circuit 531 may include a first selection transferrer 531<1>, a second selection transferrer 531<2>, a latch 531<3>, and a third selection transferrer 531<4>.

The first selection transferrer 531<1> may output one of the first to sixteenth code signals CODE<1:16> and the first to sixteenth failure addresses FADD<1:16> as first to sixteenth selection code signals SCD<1:16> based on a logic level of the selection signal TM_SEL. The first selection transferrer 531<1> may output the first to sixteenth code signals CODE<1:16> as the first to sixteenth selection code signals SCD<1:16> when the logic level of the selection signal TM_SEL is enabled to a logic high level. The first selection transferrer 531<1> may output the first to sixteenth failure addresses FADD<1:16> as the first to sixteenth selection code signals SCD<1:16> when the logic level of the selection signal TM_SEL is disabled to a logic low level.

The second selection transferrer 531<2> may output one of the first test latch signal TM_LAT1 and the repair input signal RIN as a latch control signal LCTR based on a logic level of the selection signal TM_SEL. The second selection transferrer 531<2> may output the first test latch signal TM_LAT1 as the latch control signal LCTR when the logic level of the selection signal TM_SEL is enabled to a logic high level. The second selection transferrer 531<2> may output the repair input signal RIN as the latch control signal LCTR when the logic level of the selection signal TM_SEL is disabled to a logic low level.

The latch 531<3> may store the first to sixteenth selection code signals SCD<1:16> when the latch control signal LCTR is enabled. The latch 531<3> may output the stored first to sixteenth selection code signals SCD<1:16> as the first to sixteenth latch code signals LCD<1:16> when the latch control signal LCTR is enabled.

The third selection transferrer 531<4> may output one of the first to sixteenth latch code signals LCD<1:16> and the first to sixteenth mode information signals MRD<1:16> as the first to sixteenth fuse data FD<1:16> based on a logic level of the mode selection signal MR_SEL. The third selection transferrer 531<4> may output the first to sixteenth mode information signals MRD<1:16> as the first to sixteenth fuse data FD<1:16> when the logic level of the mode selection signal MR_SEL is enabled to a logic high level. The third selection transferrer 531<4> may output the first to sixteenth latch code signals LCD<1:16> as the first to sixteenth fuse data FD<1:16> when the logic level of the mode selection signal MR_SEL is disabled to a logic low level.

A transmitter and a receiver that are activated after the start of a normal operation of the semiconductor package 1, according to an embodiment of the present disclosure, are described as follows with reference to FIG. 14.

When the logic level of the first chip ID CID<1> is a logic low level L and the logic level of the second chip ID CID<2> is a logic low level L in a normal operation, the first master transmitter T211 and first master receiver R211 of the first memory device 210 may be activated and may input and output the master data MD.

When the logic level of the first chip ID CID<1> is a logic high level H and the logic level of the second chip ID CID<2> is a logic low level L in a normal operation, the second slave transmitter T222 and second slave receiver R222 of the second memory device 220 may be activated and may input and output the first internal data ID1.

When the logic level of the first chip ID CID<1> is a logic low level L and the logic level of the second chip ID CID<2> is a logic high level H in a normal operation, a seventh slave transmitter T233 and seventh slave receiver R233 of the third memory device 230 may be activated and may input and output second internal data ID2.

When the logic level of the first chip ID CID<1> is a logic high level H and the logic level of the second chip ID CID<2> is a logic high level H in a normal operation, a twelfth slave transmitter T244 and twelfth slave receiver R244 of the fourth memory device 240 may be activated and may input and output third internal data ID3.

A transmitter and a receiver that are activated after the start of a training operation of the semiconductor package 1, according to an embodiment of the present disclosure, are described as follows with reference to FIG. 15.

In a training operation, the first master transmitter T211 of the first memory device 210 may be activated and may output the master data MD. The first slave receiver R221 of the second memory device 220 may be activated and may receive the master data MD. The second slave transmitter T222 and second slave receiver R222 of the second memory device 220 may be activated and may input and output the first internal data ID1. A fifth slave receiver R231 of the third memory device 230 may be activated and may receive the master data MD. The seventh slave transmitter T233 and seventh slave receiver R233 of the third memory device 230 may be activated and may input and output the second internal data ID2. A ninth slave receiver R241 of the fourth memory device 240 may be activated and may receive the master data MD. A twelfth slave transmitter T244 and twelfth slave receiver R244 of the fourth memory device 240 may be activated and may input and output the third internal data ID3.

An operation that programs a test code by inputting and outputting data through a transmitter and a receiver that are activated after the start of a training operation of the semiconductor package 1, according to an embodiment of the present disclosure, is described as follows with reference to FIG. 16.

The first clock generation circuit 212 of the first memory device 210 may generate the first internal clock ICLK1 having a fixed delay when the first to fourth test codes TM<1:4> are input.

The first core circuit 213 of the first memory device 210 may be activated by the first chip ID CID<1> having a logic low level and the second chip ID CID<2> having a logic low level and may output the master data MD that has been stored in the first core circuit 213 in synchronization with the first internal clock ICLK1.

The first master transmitter T211 of the first memory device 210 may be activated by the first chip ID CID<1> having a logic low level and the second chip ID CID<2> having a logic low level, which are input after the start of a normal operation and may output the master data MD.

The second clock generation circuit 222 of the second memory device 220 may generate the second internal clock ICLK2 having a delay that is adjusted based on a combination of logic levels of the first to fourth test codes TM<1:4> that are sequentially counted.

The second core circuit 223 of the second memory device 220 may be activated by the first chip ID CID<1> having a logic low level and the second chip ID CID<2> having a logic low level and may output the first internal data ID1 that has been stored in the second core circuit 223 in synchronization with the second internal clock ICLK2.

The first slave receiver R221 of the second memory device 220 may be activated by the first chip ID CID<1> having a logic high level and the second chip ID CID<2> having a logic low level, which are input after the start of a normal operation and may generate the first transfer master data TMD1 by receiving the master data MD. The second slave transmitter T222 and the second slave receiver R222 may be activated by the first chip ID CID<1> having a logic high level and the second chip ID CID<2> having a logic low level, which are input after the start of a normal operation and may generate the first transfer internal data TID1 by receiving the first internal data ID1.

The first comparison circuit 224 of the second memory device 220 may generate the first test latch signal TM_LAT1 that is enabled when a time point at which the first transfer master data TMD1, received from the first slave receiver R221, are input is identical to a time point at which the first transfer internal data TID1, received from the second slave receiver R222, are input.

The second clock generation circuit 222 of the second memory device 220 may store the first to fourth test codes TM<1:4> when the first test latch signal TM_LAT1 is enabled. The second clock generation circuit 222 may program the stored first to fourth test codes TM<1:4> when a training operation is terminated.

A third clock generation circuit 232 of the third memory device 230 may generate a third internal clock ICLK3 having a delay that is adjusted based on a combination of logic levels of the first to fourth test codes TM<1:4> that are sequentially counted.

A third core circuit 233 of the third memory device 230 may be activated by the first chip ID CID<1> having a logic low level and the second chip ID CID<2> having a logic low level and may output the second internal data ID2 that has been stored in the third core circuit 233 in synchronization with the third internal clock ICLK3.

The fifth slave receiver R231 of the third memory device 230 may be activated by the first chip ID CID<1> having a logic low level and the second chip ID CID<2> having a logic high level, which are input after the start of a normal operation and may generate second transfer master data TMD2 by receiving the master data MD. The seventh slave transmitter T233 and the seventh slave receiver R233 may be activated by the first chip ID CID<1> having a logic low level and the second chip ID CID<2> having a logic high level, which are input after the start of a normal operation and may generate second transfer internal data TID2 by receiving the second internal data ID2.

The second comparison circuit 234 of the third memory device 230 may generate a second test latch signal TM_LAT2 that is enabled when a time point at which the second transfer master data TMD2, received from the fifth slave receiver R231, are input is identical to a time point at which the second transfer internal data TID2, received from the seventh slave receiver R233, are input.

The third clock generation circuit 232 of the third memory device 230 may store the first to fourth test codes TM<1:4> when the second test latch signal TM_LAT2 is enabled. The third clock generation circuit 232 may program the stored first to fourth test codes TM<1:4> when the training operation is terminated.

A fourth clock generation circuit 242 of the fourth memory device 240 may generate a fourth internal clock ICLK4 having a delay that is adjusted based on a combination of logic levels of the first to fourth test codes TM<1:4> that are sequentially counted.

A fourth core circuit 243 of the fourth memory device 240 may be activated by the first chip ID CID<1> having a logic low level and the second chip ID CID<2> having a logic low level and may output the third internal data ID3 that has been stored in the fourth core circuit 243 in synchronization with the fourth internal clock ICLK4.

A ninth slave receiver R241 of the fourth memory device 240 may be activated by the first chip ID CID<1> having a logic high level and the second chip ID CID<2> having a logic high level, which are input after the start of a normal operation and may generate third transfer master data TMD3 by receiving the master data MD. The twelfth slave transmitter T244 and the twelfth slave receiver R244 may be activated by the first chip ID CID<1> having a logic high level and the second chip ID CID<2> having a logic high level, which are input after the start of a normal operation and may generate the third transfer internal data TID3 by receiving the third internal data ID3. A third comparison circuit 244 of the fourth memory device 240 may generate a third test latch signal TM_LAT3 that is enabled when a time point at which the third transfer master data TMD3, received from the ninth slave receiver R241, are input is identical to a time point at which the third transfer internal data TID3, received from the twelfth slave receiver R244, are input.

The fourth clock generation circuit 242 of the fourth memory device 240 may store the first to fourth test codes TM<1:4> when the third test latch signal TM_LAT3 is enabled. The fourth clock generation circuit 242 may program the stored first to fourth test codes TM<1:4> when a training operation is terminated.

The semiconductor package 1 according to such an embodiment of the present disclosure can simultaneously adjust operating speeds of the first to fourth memory devices 210 to 240 in a way to program the first to fourth test codes TM<1:4> having different logic level combinations by comparing a time point at which the master data MD, output by the first memory device 210, are input to each of the time points at which the first to third internal data ID1 to ID3 that are generated within the second to fourth memory devices 220 to 240 are input after the start of a training operation.

A training operation of the semiconductor package 1 according to an embodiment of the present disclosure is described with reference to FIG. 17, but an operation that programs, by the first memory device 210 and the second memory device 220, a test code by inputting and outputting data is described as follows. The master data MD, illustrated in FIG. 17, may be set identically with the first transfer master data TMD1, and the first internal data ID1, illustrated in FIG. 17, may be set identically with the first transfer internal data TID1.

First, a first training operation is described. At a time point T1, the first master transmitter T211 of the first memory device 210 may be activated and may output the master data MD. At a time point T3, the first slave receiver R221 of the second memory device 220 may be activated and may receive the master data MD, and the second slave transmitter T222 and second slave receiver R222 of the second memory device 220 may be activated and may input and output the first internal data ID1. At this time, the first first to fourth test codes TM<1:4> might not be programmed because the master data MD are input at the time point T1 and the first internal data ID1 are input at the time point T3.

Next, a second training operation is described. At the time point T1, the first master transmitter T211 of the first memory device 210 may be activated and may output the master data MD. At a time point T2, the first slave receiver R221 of the second memory device 220 may be activated and may receive the master data MD, and the second slave transmitter T222 and second slave receiver R222 of the second memory device 220 may be activated and may input and output the first internal data ID1. At this time, the second first to fourth test codes TM<1:4> might not be programmed because the master data MD are input at the time point T1 and the first internal data ID1 are input at the time point T2.

Next, a third training operation is described. At the time point T1, the first master transmitter T211 of the first memory device 210 may be activated and may output the master data MD. At the time point T1, the first slave receiver R221 of the second memory device 220 may be activated and may receive the master data MD, and the second slave transmitter T222 and second slave receiver R222 of the second memory device 220 may be activated and may input and output the first internal data ID1. At this time, the second memory device 220 may store the third first to fourth test codes TM<1:4> because the master data MD are input at the time point T1 and the first internal data ID1 are input at the time point T1. The second memory device 220 may program the stored third first to fourth test codes TM<1:4> when the training operation is terminated.

The semiconductor package 1 according to such an embodiment of the present disclosure can adjust operating speeds of the first memory device 210 and the second memory device 220 to be identical by programming the first to fourth test codes TM<1:4> by comparing a time point at which the master data MD, output by the first memory device 210, are input to a time point at which the first internal data ID1, generated within the second memory device 220, are input after the start of a training operation. The semiconductor package 1 can prevent an error of data input and output operations in a normal operation by adjusting operating speeds of the first memory device 210 and the second memory device 220 to be identical by programming each of the first to fourth test codes TM<1:4> that adjusts the operating speeds to be identical after the start of a training operation.

A training operation of the semiconductor package 1 according to an embodiment of the present disclosure is described with reference to FIG. 18, but an operation that programs, by the first to fourth memory devices 210 to 240, a test code by inputting and outputting data is described as follows. First, training operations of the first memory device 210 and the second memory device 220 are described as follows. In this case, the master data MD, illustrated in FIG. 18, may be set identically with the first transfer master data TMD1, and the first internal data ID1, illustrated in FIG. 18, may be set identically with the first transfer internal data TID1.

In the first training operation and the second training operation, the first first to fourth test codes TM<1:4> and the second first to fourth test codes TM<1:4> might not be programmed because the master data MD and the first internal data ID1 are input at different time points.

In the third training operation, at a time point T11, the first master transmitter T211 of the first memory device 210 may be activated and may output the master data MD. At the time point T11, the first slave receiver R221 of the second memory device 220 may be activated and may receive the master data MD, and the second slave transmitter T222 and second slave receiver R222 of the second memory device 220 may be activated and may input and output the first internal data ID1. At this time, since the master data MD are input at the time point T11 and the first internal data ID1 are input at the time point T11, the second clock generation circuit 222 of the second memory device 220 may store the third first to fourth test codes TM<1:4>. When the third training operation is terminated, the second clock generation circuit 222 of the second memory device 220 may program the stored third first to fourth test codes TM<1:4>.

Next, training operations of the first memory device 210 and the third memory device 230 are described as follows. In this case, the master data MD, illustrated in FIG. 18, may be set identically with the second transfer master data TMD2, and the second internal data ID2, illustrated in FIG. 18, may be set identically with the second transfer internal data TID2.

In the first training operation, the first first to fourth test codes TM<1:4> might not be programmed because the master data MD and the second internal data ID2 are input at different time points.

In the second training operation, at a time point T21, the first master transmitter T211 of the first memory device 210 may be activated and may output the master data MD. At the time point T21, the fifth slave receiver R231 of the third memory device 230 may be activated and may receive the master data MD, and the seventh slave transmitter T233 and seventh slave receiver R233 of the third memory device 230 may be activated and may input and output the second internal data ID2. At this time, the third clock generation circuit 232 of the third memory device 230 may store the second first to fourth test codes TM<1:4> because the master data MD are input at the time point T21 and the second internal data ID2 are input at the time point T21. When the second training operation is terminated, the third clock generation circuit 232 of the third memory device 230 may program the stored second first to fourth test codes TM<1: 4>.

Next, training operations of the first memory device 210 and the fourth memory device 240 are described as follows. In this case, the master data MD, illustrated in FIG. 18, may be set identically with the third transfer master data TMD3, and the third internal data ID3, illustrated in FIG. 18, may be set identically with the third transfer internal data TID3.

In the first training operation, the first first to fourth test codes TM<1:4> might not be programmed because the master data MD and the third internal data ID3 are input at different time points.

In the second training operation, at a time point T31, the first master transmitter T211 of the first memory device 210 may be activated and may output the master data MD. At the time point T31, the ninth slave receiver R241 of the fourth memory device 240 may be activated and may receive the master data MD, and the twelfth slave transmitter T244 and twelfth slave receiver R244 of the fourth memory device 240 may be activated and may input and output the third internal data ID3. At this time, the fourth clock generation circuit 242 of the fourth memory device 240 may store the second first to fourth test codes TM<1:4> because the master data MD are input at the time point T31 and the third internal data ID3 are input at the time point T31. When the second training operation is terminated, the fourth clock generation circuit 242 of the fourth memory device 240 may program the stored second first to fourth test codes TM<1:4>.

The semiconductor package 1, according to such an embodiment of the present disclosure, can adjust operating speeds of the first to fourth memory devices 210 to 240 to be identical by programming each of the first to fourth test codes TM<1:4> having different logic level combinations by comparing a time point at which the master data MD, output by the first memory device 210, are input and each of time points at which the first to third internal data ID1 to ID3, generated within the second to fourth memory devices 220 to 240, are input after the start of a training operation. The semiconductor package 1 can prevent an error of data input and output operations in a normal operation by adjusting operating speeds of the first to fourth memory devices 210 to 240 to be identical by programming each of the first to fourth test codes TM<1:4> having different logic level combinations and by adjusting the operating speeds to be identical after the start of a training operation.

FIG. 19 is a diagram for describing a block that is activated after the start of a training operation of a semiconductor device according to an example of the present disclosure.

Prior to a description, the internal components of a first memory device 210_1, a second memory device 220_1, a third memory device 230_1, and a fourth memory device 240_1 that are included in a semiconductor device 20_1 may be identically implemented. The first memory device 210_1 may be implemented as a master device, and the second memory device 220_1, the third memory device 230_1, and the fourth memory device 240_1 may be implemented as slave devices. The memory device that is implemented as the master device may be implemented as any one of the first memory device 210_1, the second memory device 220_1, the third memory device 230_1, and the fourth memory device 240_1 in different embodiments. The memory devices that are implemented as the slave devices may be implemented as memory devices, except a master device, which can be the first memory device 210_1, the second memory device 220_1, the third memory device 230_1, or the fourth memory device 240_1 in different embodiments.

The first memory device 210_1 may include a first clock generation circuit (CLK GEN1) 212_1, a first core circuit (CORE1) 213_1, a first comparison circuit (CMP1) 214_1, first to fourth master transmitters, and first to fourth master receivers.

The first clock generation circuit 2121 may be activated after the start of a training operation and may generate a first internal clock ICLK1 having a fixed delay when first to fourth test codes TM<1:4> are input.

The first core circuit 213_1 may be activated after the start of a training operation and may output master data MD that has been stored in the first core circuit 213_1 in synchronization with the first internal clock ICLK1.

A first master transmitter T211_1, among the first to fourth master transmitters, may be activated and may output the master data MD after the start of a training operation.

The second to fourth master transmitter and the first to fourth master receivers may be deactivated after the start of a training operation.

The first comparison circuit 214_1 may be deactivated after the start of a training operation. The first comparison circuit 214_1 may generate a first test latch signal TM_LAT1 by sampling a transfer internal data TID that is generated from any one of first to third internal data ID1 to ID3 that are output by the second memory device 220_1, the third memory device 230_1, and the fourth memory device 240_1, based on transfer master data TMD that is generated from the master data MD.

The second memory device 220_1 may include a second clock generation circuit (CLK GEN2) 222_1, a second core circuit (CORE2) 2231, a second comparison circuit (CMP2) 224_1, first to fourth slave transmitters, and first to fourth slave receivers.

The second clock generation circuit 222_1 may be activated after the start of a training operation and may generate a second internal clock ICLK2 based on the first to fourth test codes TM<1:4>. The second clock generation circuit 222_1 may generate the second internal clock ICLK2 having a delay that is adjusted based on a combination of logic levels of the first to fourth test codes TM<1:4> after the start of a training operation. The second clock generation circuit 222_1 may store the first to fourth test codes TM<1:4> when a second test latch signal TM_LAT2 is enabled after the start of a training operation. The second clock generation circuit 222_1 may program the stored first to fourth test codes TM<1:4> when the training operation is terminated. The second clock generation circuit 222_1 may generate the second internal clock ICLK2 having a delay that has been adjusted based on the programmed first to fourth test codes TM<1:4> after the start of a normal operation.

The second core circuit 223_1 may be activated after the start of a training operation and may output the first internal data ID1 that has been stored in the second core circuit 223_1 in synchronization with the second internal clock ICLK2.

A first slave receiver R221_1, among the first to fourth slave receivers, may be activated after the start of a training operation and may generate first transfer master data TMD1 by receiving the master data MD.

A second slave transmitter T222_1, among the first to fourth slave transmitters, may be activated after the start of a training operation and may output the first internal data ID1. A second slave receiver R222_1, among the first to fourth slave receivers, may be activated after the start of a training operation and may generate the first transfer internal data TID1 by receiving the first internal data ID1 from the second transmitter T222_1.

The first slave transmitter, the third slave transmitter, and the fourth slave transmitter may be deactivated after the start of a training operation. The third slave receiver and the fourth slave receiver may be deactivated after the start of a training operation.

The second comparison circuit 224_1 may be activated after the start of a training operation and may generate the second test latch signal TM_LAT2 by sampling first transfer internal data TID1 based on the first transfer master data TMD1. The second comparison circuit 224_1 may be activated after the start of a training operation and may generate the second test latch signal TM_LAT2 by comparing a time point at which the first transfer master data TMD1, received from the first slave receiver R221_1, are input to a time point at which the first transfer internal data TID1, received from the second slave receiver R222_1, are input. The second comparison circuit 224_1 may generate the second test latch signal TM_LAT2 that is enabled when the time point at which the first transfer master data TMD1 are input is identical to the time point at which the first transfer internal data TID1 are input after the start of the training operation.

The third memory device 230_1 may include a third clock generation circuit (CLK GEN3) 232_1, a third core circuit (CORE3) 233_1, a third comparison circuit (CMP3) 234_1, first to fourth slave transmitters, and first to fourth slave receivers.

The third clock generation circuit 232_1 may be activated after the start of a training operation and may generate a third internal clock ICLK3 based on the first to fourth test codes TM<1:4>. The third clock generation circuit 232_1 may generate the third internal clock ICLK3 having a delay that is adjusted based on a combination of logic levels of the first to fourth test codes TM<1:4> after the start of a training operation. The third clock generation circuit 232_1 may store the first to fourth test codes TM<1:4> when a third test latch signal TM_LAT3 is enabled after the start of a training operation. The third clock generation circuit 232_1 may program the stored first to fourth test codes TM<1:4> when the training operation is terminated. The third clock generation circuit 232_1 may generate the third internal clock ICLK3 having a delay that has been adjusted based on the programmed first to fourth test codes TM<1:4> after the start of a normal operation.

The third core circuit 233_1 may be activated after the start of a training operation and may output the second internal data ID2 that has been stored in the third core circuit 233_1 in synchronization with the third internal clock ICLK3.

A first slave receiver R231_1, among the first to fourth slave receivers, may be activated after the start of a training operation and may generate second transfer master data TMD2 by receiving the master data MD.

A third slave transmitter T233_1, among the first to fourth slave transmitters, may be activated after the start of a training operation and may output the second internal data ID2. A third slave receiver R233_1, among the first to fourth slave receivers, may be activated after the start of a training operation and may generate the second transfer internal data TID2 by receiving the second internal data ID2 from the third transmitter T233_1.

The first slave transmitter, the second slave transmitter, and the fourth slave transmitter may be deactivated after the start of a training operation. The second slave receiver and the fourth slave receiver may be deactivated after the start of a training operation.

The third comparison circuit 234_1 may be activated after the start of a training operation and may generate the third test latch signal TM_LAT3 by sampling second transfer internal data TID2 based on the second transfer master data TMD2. The third comparison circuit 234_1 may be activated after the start of a training operation and may generate the third test latch signal TM_LAT3 by comparing a time point at which the second transfer master data TMD2, received from the first slave receiver R231_1, are input to a time point at which the second transfer internal data TID2, received from the third slave receiver R233_1, are input. The third comparison circuit 234_1 may generate the third test latch signal TM_LAT3 that is enabled when the time point at which the second transfer master data TMD2 are input is identical to the time point at which the second transfer internal data TID2 are input after the start of the training operation.

The fourth memory device 240_1 may include a fourth clock generation circuit (CLK GEN4) 242_1, a fourth core circuit (CORE4) 243_1, a fourth comparison circuit (CMP4) 244_1, first to fourth slave transmitters, and first to fourth slave receivers.

The fourth clock generation circuit 242_1 may be activated after the start of a training operation and may generate a fourth internal clock ICLK4 based on the first to fourth test codes TM<1:4>. The fourth clock generation circuit 242_1 may generate the fourth internal clock ICLK4 having a delay that is adjusted based on a combination of logic levels of the first to fourth test codes TM<1:4> after the start of a training operation. The fourth clock generation circuit 242_1 may store the first to fourth test codes TM<1:4> when the fourth test latch signal TM_LAT4 is enabled after the start of a training operation. The fourth clock generation circuit 242_1 may program the stored first to fourth test codes TM<1:4> when the training operation is terminated. The fourth clock generation circuit 242_1 may generate the fourth internal clock ICLK4 having a delay that has been adjusted based on the programmed first to fourth test codes TM<1:4> after the start of a normal operation.

The fourth core circuit 243_1 may be activated after the start of a training operation and may output the third internal data ID3 that has been stored in the fourth core circuit 243_1 in synchronization with the fourth internal clock ICLK4.

A first slave receiver R241_1, among the first to fourth slave receivers, may be activated after the start of a training operation and may generate third transfer master data TMD3 by receiving the master data MD.

A fourth slave transmitter T244_1, among the first to fourth slave transmitters, may be activated after the start of a training operation and may output the third internal data ID3. A fourth slave receiver R244_1, among the first to fourth slave receivers, may be activated after the start of a training operation and may generate third transfer internal data TID3 by receiving the third internal data ID3 from the fourth transmitter T244_1.

The first slave transmitter, the second slave transmitter, and the third slave transmitter may be deactivated after the start of a training operation. The second slave receiver and the third slave receiver may be deactivated after the start of a training operation.

The fourth comparison circuit 244_1 may be activated after the start of a training operation and may generate a fourth test latch signal TM_LAT4 by sampling the third transfer internal data TID3 based on the third transfer master data TMD3. The fourth comparison circuit 244_1 may be activated after the start of a training operation and may generate the fourth test latch signal TM_LAT4 by comparing a time point at which the third transfer master data TMD3, received from the first slave receiver R241_1, are input to a time point at which the third transfer internal data TID3, received from the fourth slave receiver R244_1, are input. The fourth comparison circuit 244_1 may generate the fourth test latch signal TM_LAT4 that is enabled when the time point at which the third transfer master data TMD3 are input is identical to the time point at which the third transfer internal data TID3 are input are identical after the start of a training operation.

FIG. 20 is a diagram illustrating a cross-sectional structure according to an example of a semiconductor device 20*a* of the present disclosure. As illustrated in FIG. 20, the semiconductor device 20*a* may include a substrate 200*a*, and multiple first to eighth memory devices 210*a* to 280*a*.

A cross-sectional structure of the semiconductor device 20*a* is described. The multiple first to eighth memory devices 210*a* to 280*a* may be constructed in the form of a structure in which the first to eighth memory devices 210*a* to 280*a* are vertically stacked on the substrate 200*a* in a stair form.

The first memory device 210*a*, that is, a master device, may be stacked on the substrate 200*a*. The second memory device 220*a*, that is, a slave device, may be stacked on the first memory device 210*a*. The third memory device 230*a*, that is, a slave device, may be stacked on the second memory device 220*a*. The fourth memory device 240*a*, that is, a slave device, may be stacked on the third memory device 230*a*.

The first memory device 210*a* may include multiple sub-pads (SUB PAD) and a main pad (MAIN PAD). Each of the second memory device 220*a*, the third memory device 230*a*, and the fourth memory device 240*a* may include the multiple sub-pads. The multiple sub-pads that are included in the first memory device 210*a* and the multiple sub-pads that are included in the second memory device 220*a*, the third memory device 230*a*, and the fourth memory device 240*a* may be electrically connected by a first wire W1. The first memory device 210*a*, the second memory device 220*a*, the third memory device 230*a*, and the fourth memory device 240*a* may be implemented to input and output commands, addresses, data, and signals through the first wire W1.

The fifth memory device 250*a*, that is, a master device, may be stacked on the fourth memory device 240*a*. The sixth memory device 260*a*, that is, a slave device, may be stacked on the fifth memory device 250*a*. The seventh memory device 270*a*, that is, a slave device, may be stacked on the sixth memory device 260*a*. The eighth memory device 280*a*, that is, a slave device, may be stacked on the seventh memory device 270*a*.

The fifth memory device 250*a* may include multiple sub-pads (SUB PAD) and a main pad (MAIN PAD). Each of the sixth memory device 260*a*, the seventh memory device 270*a*, and the eighth memory device 280*a* may include the multiple sub-pads. The multiple sub-pads that are included in the fifth memory device 250*a* and the multiple sub-pads that are included in the sixth memory device 260*a*, the seventh memory device 270*a*, and the eighth memory device 280*a* may be electrically connected through a second wire W2. The fifth memory device 250*a*, the sixth memory device 260*a*, the seventh memory device 270*a*, and the eighth memory device 280*a* may be implemented to input and output commands, addresses, data, and signals through the second wire W2.

The main pad that is included in the first memory device 210*a* and the main pad that is included in the fifth memory device 250*a* may be electrically connected through a third wire W3. The first memory device 210*a* and the fifth memory device 250*a* may be implemented to input and output commands, addresses, data, and signals through the third wire W3.

FIG. 21 is a block diagram illustrating a construction according to an embodiment of an electronic system 1000 according to an embodiment of the present disclosure. As illustrated in FIG. 21, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 may control operations of the semiconductor devices 1400(K:1). Each of the semiconductor devices 1400(K:1) can adjust operating speeds of multiple memory devices to be identical by programming each of test codes when a time point at which master data that are output by one of the multiple memory devices is input is identical to a time point at which internal data that are generated within the remaining memory devices are input after the start of a training operation. Each of the semiconductor devices 1400(K:1) can prevent an error of data input and output operations in a normal operation by adjusting operating speeds of the multiple memory devices to be identical by programming each of the test codes when time points at which data that are output by the multiple memory devices are input are identical after the start of a training operation.

The controller 1300 may be implemented as the controller 10, illustrated in FIG. 1. Each of the semiconductor devices 1400(K:1) may be implemented as the semiconductor device 20, illustrated in FIG. 1. In different embodiments, each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor package comprising:
   a first memory device configured to output master data after a start of a training operation; and
   a second memory device configured to sample internal data based on the master data after the start of the training operation, configured to store test codes that adjust a time point at which the internal data are output when a time point at which the master data are output and a time point at which the internal data are output become identical, and configured to program the stored test codes when the training operation is terminated, wherein the second memory device comprises:

a first clock generation circuit configured to generate a second internal clock having a delay that is adjusted based on a combination of logic levels of the test codes after the start of the training operation, configured to store the test codes when a test latch signal is enabled, and configured to program the stored test codes when the training operation is terminated;

a second core circuit configured to output the internal data in synchronization with the second internal clock when chip IDs having an identical logic level combination are input after the start of the training operation;

a first slave receiver configured to generate transfer master data by receiving the master data from the first memory device and configured to output the transfer master data;

a first slave transmitter configured to receive the internal data from the second core circuit and configured to output the received internal data;

a second slave receiver configured to generate transfer internal data by receiving the internal data from the first slave transmitter and configured to output the transfer internal data; and a comparison circuit configured to generate the test latch signal by comparing a time point at which the transfer master data are input to a time point at which the transfer internal data are input, wherein the first memory device and the second memory device are simultaneously enabled after the start of the training operation.

2. The semiconductor package of claim 1, wherein operating speeds of the first memory device and the second memory device are different from each other.

3. The semiconductor package of claim 1, wherein the first memory device comprises:

a first core circuit configured to output the master data in synchronization with a first internal clock when chip IDs having an identical logic level combination are input after the start of the training operation; and a master transmitter configured to receive the master data from the first core circuit and configured to output the received master data.

4. The semiconductor package of claim 3, wherein, after the start of the training operation, the first internal clock has a fixed delay.

5. The semiconductor package of claim 1, wherein the test codes are sequentially counted to reduce the delay of the second internal clock after the start of the training operation.

6. The semiconductor package of claim 1, wherein the clock generation circuit comprises:

a code generation circuit configured to generate code signals by decoding the test codes after the start of the training operation;

a second clock generation circuit configured to generate the second internal clock having a delay that is adjusted based on a combination of logic levels of the code signals after the start of the training operation and configured to generate the second internal clock having a delay that is adjusted based on a combination of logic levels of delay control signals after the start of a normal operation; and a fuse array circuit configured to store the code signals when the test latch signal is enabled, configured to program the stored code signals when the training operation is terminated, and configured to output the programmed code signals as the delay control signals.

7. The semiconductor package of claim 6, wherein:

the fuse array circuit comprises multiple electrical fuses, and when the training operation is terminated, the multiple electrical fuses are ruptured and the code signals are programmed.

8. A semiconductor package comprising:

a first memory device configured to sample first internal data based on master data after a start of a training operation and configured to program, in multiple electrical fuses, test codes that adjust a time point at which the first internal data are output when a time point at which the master data are output and a time point at which the first internal data are output become identical; and a second memory device configured to sample second internal data based on the master data after the start of the training operation and configured to program, in multiple electrical fuses, test codes that adjust a time point at which the second internal data are output when a time point at which the master data are output and a time point at which the second internal data are output become identical, wherein the first memory device and the second memory device are simultaneously enabled after the start of the training operation, and wherein the first memory device comprises:

a first input/output control circuit configured to generate a first slave transmission control signal and first and second slave reception control signals that are enabled based on an input chip ID having a first logic level combination after a start of a normal operation;

a first clock generation circuit configured to generate a first internal clock having a delay that is adjusted based on a combination of logic levels of the test codes after the start of the training operation, configured to store the test code when a first test latch signal is enabled, and configured to program the stored test codes when the training operation is terminated;

a first core circuit configured to output the first internal data in synchronization with the first internal clock when a chip ID having a second logic level combination is input;

a first slave receiver configured to generate first transfer master data by receiving the master data when the first slave reception control signal is enabled and configured to output the first transfer master data;

a first slave transmitter configured to receive the first internal data from the first core circuit when the first slave transmission control signal is enabled and configured to output the received first internal data;

a second slave receiver configured to generate first transfer internal data by receiving the first internal data from first slave transmitter when the second slave reception control signal is enabled and configured to output the first transfer internal data; and a first comparison circuit configured to generate the first test latch signal by comparing a time point at which the first transfer master data are input to a time point at which the first transfer internal data are input.

9. The semiconductor package of claim 8, wherein the training operation is an operation of adjusting the time point at which the master data are output and the time points at which the first and second internal data are output to be identical.

10. The semiconductor package of claim 8, wherein the master data are input to the first memory device and the second memory device at an identical time point after the start of the training operation.

11. The semiconductor package of claim 8, wherein the first clock generation circuit comprises:

a first code generation circuit configured to generate a first code signal by decoding the test codes after the start of the training operation;

a first DLL circuit configured to generate the first internal clock having a delay that is adjusted based on a logic level combination of the first code signal after the start of the training operation and configured to generate the first internal clock having a delay that is adjusted based on a logic level combination of a first delay control signal after the start of the normal operation; and a first fuse array circuit configured to store the first code signal when the first test latch signal is enabled, configured to program the stored first code signal when the training operation is terminated, and configured to output the programmed first code signal as the first delay control signal.

12. The semiconductor package of claim 11, wherein:

the first fuse array circuit comprises multiple electrical fuses, and when the training operation is terminated, the multiple electrical fuses are ruptured and the first code signal is programmed.

13. The semiconductor package of claim 8, wherein the second memory device comprises:

a second input/output control circuit configured to generate a second slave transmission control signal and third and fourth slave reception control signals that are enabled based on an input chip ID having a third logic level combination after the start of a normal operation;

a second clock generation circuit configured to generate a second internal clock having a delay that is adjusted based on a combination of logic levels of the test codes after the start of the training operation, configured to store the test codes when a second test latch signal is enabled, and configured to program the stored test codes when the training operation is terminated;

a second core circuit configured to output the second internal data in synchronization with the second internal clock when a chip ID having a second logic level combination is input;

a fourth slave receiver configured to generate second transfer master data by receiving the master data when the third slave reception control signal is enabled and configured to output the second transfer master data;

a second slave transmitter configured to receive the second internal data from the second core circuit when the second slave transmission control signal is enabled and configured to output the second internal data;

a fourth slave receiver configured to generate second transfer internal data by receiving the second internal data from the second slave transmitter when the fourth slave reception control signal is enabled and configured to output the second transfer internal data; and a second comparison circuit configured to generate the second test latch signal by comparing a time point at which the second transfer master data are input to a time point at which the second transfer internal data are input.

14. The semiconductor package of claim 13, wherein the second clock generation circuit comprises:

a second code generation circuit configured to generate a second code signal by decoding the test codes after the start of the training operation;

a second DLL circuit configured to generate the second internal clock having a delay that is adjusted based on a logic level combination of the second code signal after the start of the training operation and configured to generate the second internal clock having a delay that is adjusted based on a logic levels combination of the second delay control signal after the start of the normal operation; and a second fuse array circuit configured to store the second code signal when the second test latch signal is enabled, configured to program the stored second code signal when the training operation is terminated, and configured to output the programmed second code signal as the second delay control signal.

15. The semiconductor package of claim 14, wherein:

the second fuse array circuit comprises multiple electrical fuses, and when the training operation is terminated, the multiple electrical fuses are ruptured and the second code signal is programmed.

* * * * *